(12) United States Patent
Kamata et al.

(10) Patent No.: US 11,948,636 B2
(45) Date of Patent: Apr. 2, 2024

(54) MEMORY DEVICE

(71) Applicant: Kioxia Corporation, Tokyo (JP)

(72) Inventors: Yoshiki Kamata, Meguro Tokyo (JP); Yoshiaki Asao, Kawasaki Kanagawa (JP); Yukihiro Nomura, Taito Tokyo (JP); Misako Morota, Koga Ibaraki (JP); Daisaburo Takashima, Yokohama Kanagawa (JP); Takahiko Iizuka, Kamakura Kanagawa (JP); Shigeru Kawanaka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 129 days.

(21) Appl. No.: 17/693,935

(22) Filed: Mar. 14, 2022

(65) Prior Publication Data
US 2023/0102229 A1   Mar. 30, 2023

(30) Foreign Application Priority Data

Sep. 13, 2021   (JP) .................................. 2021-148550

(51) Int. Cl.
*G11C 13/00*   (2006.01)
*G11C 5/06*   (2006.01)
(Continued)

(52) U.S. Cl.
CPC ............ *G11C 13/0069* (2013.01); *G11C 5/06* (2013.01); *H10B 63/30* (2023.02); *H10N 70/826* (2023.02);
(Continued)

(58) Field of Classification Search
CPC .................. G11C 13/0069; G11C 5/06; G11C 2013/0078; G11C 2213/75;
(Continued)

(56) References Cited

U.S. PATENT DOCUMENTS

| 5,894,447 A | 4/1999 | Takashima |
| 8,456,890 B2 | 6/2013 | Ichihara |

(Continued)

FOREIGN PATENT DOCUMENTS

| CN | 115224189 A | * 10/2022 | ........... H01L 27/281 |
| JP | 2008-160004 A | 7/2008 | |

(Continued)

OTHER PUBLICATIONS

A. Sebastian et al., "Multi-level storage in phase-change memory devices," E/PCOS 2016, 6 pages (2016).
(Continued)

*Primary Examiner* — Michael T Tran
(74) *Attorney, Agent, or Firm* — Finnegan, Henderson, Farabow, Garrett & Dunner, LLP

(57) ABSTRACT

According to one embodiment, a memory device includes a stacked structure including a plurality of conductive layers stacked to be apart from each other in a first direction, and a pillar structure including a resistance change portion extending in the first direction in the stacked structure, and a semiconductor portion which extends in the first direction in the stacked structure and which includes a first portion provided along the resistance change portion and a second portion extending from the first portion in at least one direction intersecting the first direction.

23 Claims, 36 Drawing Sheets

(51) Int. Cl.
*H10B 63/00* (2023.01)
*H10N 70/00* (2023.01)

(52) U.S. Cl.
CPC .. *G11C 2013/0078* (2013.01); *G11C 2213/75* (2013.01)

(58) Field of Classification Search
CPC .... G11C 2213/71; H10B 63/30; H10B 63/10; H10B 63/34; H10B 63/845; H10N 70/826; H10N 70/823; H10N 70/8828; H10N 70/231
USPC .................................................. 365/148, 158
See application file for complete search history.

(56) References Cited

U.S. PATENT DOCUMENTS

| | | | |
|---|---|---|---|
| 8,563,961 | B2 | 10/2013 | Sasago et al. |
| 10,079,059 | B2 | 9/2018 | Buchanan |
| 10,103,324 | B2 | 10/2018 | Suzuki et al. |
| 10,153,429 | B2 | 12/2018 | Kamata et al. |
| 10,546,896 | B2 | 1/2020 | Arayashiki et al. |
| 2008/0149913 | A1 | 6/2008 | Tanaka et al. |
| 2010/0182828 | A1 | 7/2010 | Shima et al. |
| 2013/0200331 | A1 | 8/2013 | Morikawa et al. |
| 2014/0145137 | A1* | 5/2014 | Ju ........................ H10B 63/84 257/2 |
| 2015/0221700 | A1* | 8/2015 | Cho ........................ G11C 11/56 257/4 |
| 2018/0277597 | A1 | 9/2018 | Arayashiki et al. |
| 2019/0115391 | A1 | 4/2019 | Nardi et al. |
| 2019/0287983 | A1 | 9/2019 | Koyama |
| 2019/0393270 | A1* | 12/2019 | Kim ........................ H10N 70/24 |
| 2020/0006427 | A1* | 1/2020 | Sato ........................ H10B 63/845 |
| 2020/0402564 | A1* | 12/2020 | Piccardi ................ G11C 29/021 |
| 2021/0202840 | A1* | 7/2021 | Kim ........................ H10B 63/30 |
| 2021/0384258 | A1* | 12/2021 | Hwang ................ H10N 70/24 |
| 2022/0020818 | A1* | 1/2022 | Kim ........................ G11C 11/5685 |
| 2022/0093688 | A1* | 3/2022 | Lue ........................ H10B 63/20 |
| 2023/0121581 | A1* | 4/2023 | Kim ........................ H10N 70/24 257/5 |
| 2023/0371285 | A1* | 11/2023 | Lee ........................ H10B 63/34 |

FOREIGN PATENT DOCUMENTS

| | | | | |
|---|---|---|---|---|
| JP | 2012-64271 | A | 3/2012 | |
| JP | 2013-161978 | A | 8/2013 | |
| JP | 5462490 | B2 | 4/2014 | |
| JP | 2018-163971 | A | 10/2018 | |
| JP | 2019-161118 | A | 9/2019 | |
| JP | 2023041280 | A * | 3/2023 | ......... G11C 13/0069 |
| WO | WO 2011 074545 | A1 | 6/2011 | |
| WO | WO-2018071143 | A2 * | 4/2018 | ......... G11C 11/2275 |

OTHER PUBLICATIONS

M. Kinoshita et al., "Scalable 3-D vertical chain-cell-type phase change memory with $4F^2$ poly-Si diodes", 2012 Symp. on VLSI Tech. (VLSIT) Digest of Tech. Papers, pp. 35-36, DOI: 10.1109/VLSIT.2012.6242448 (2012).

* cited by examiner

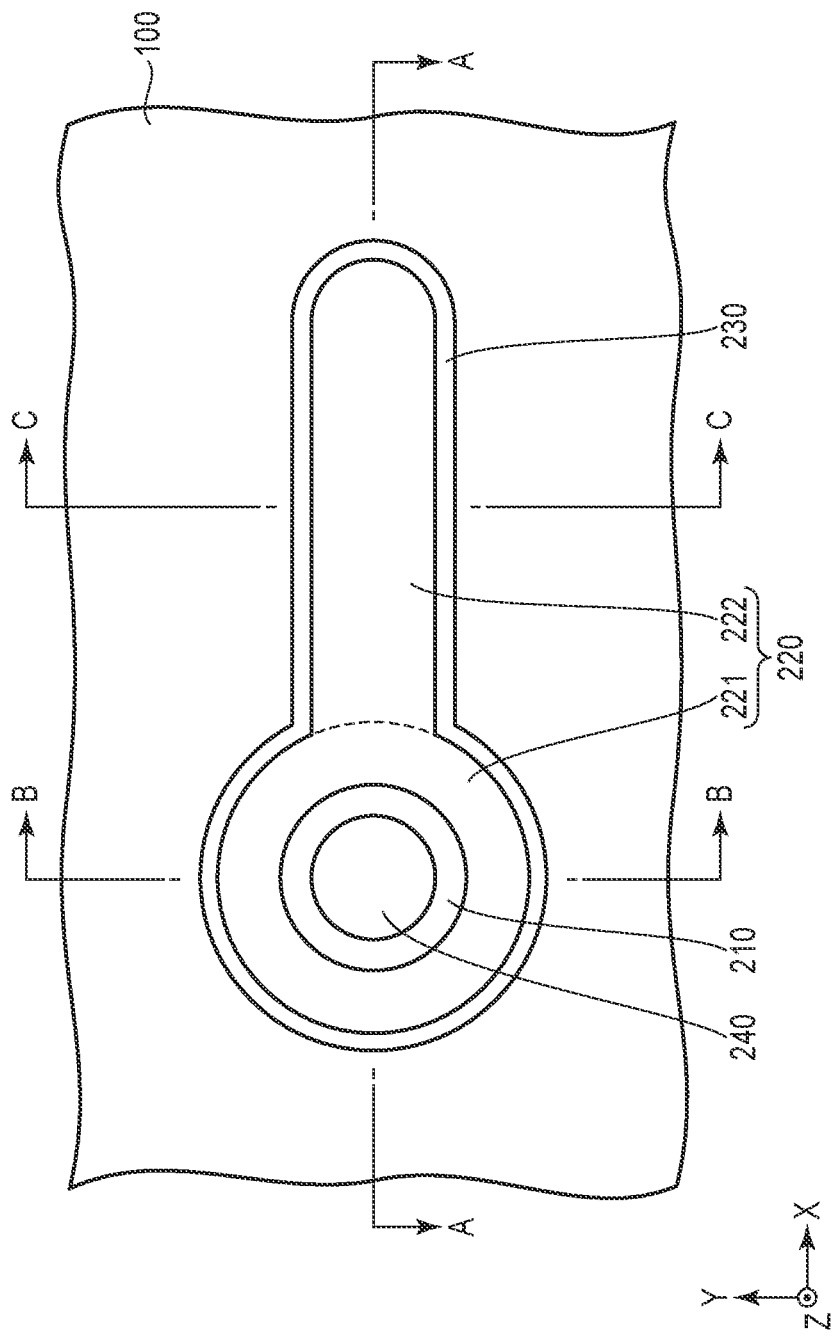
F I G. 4

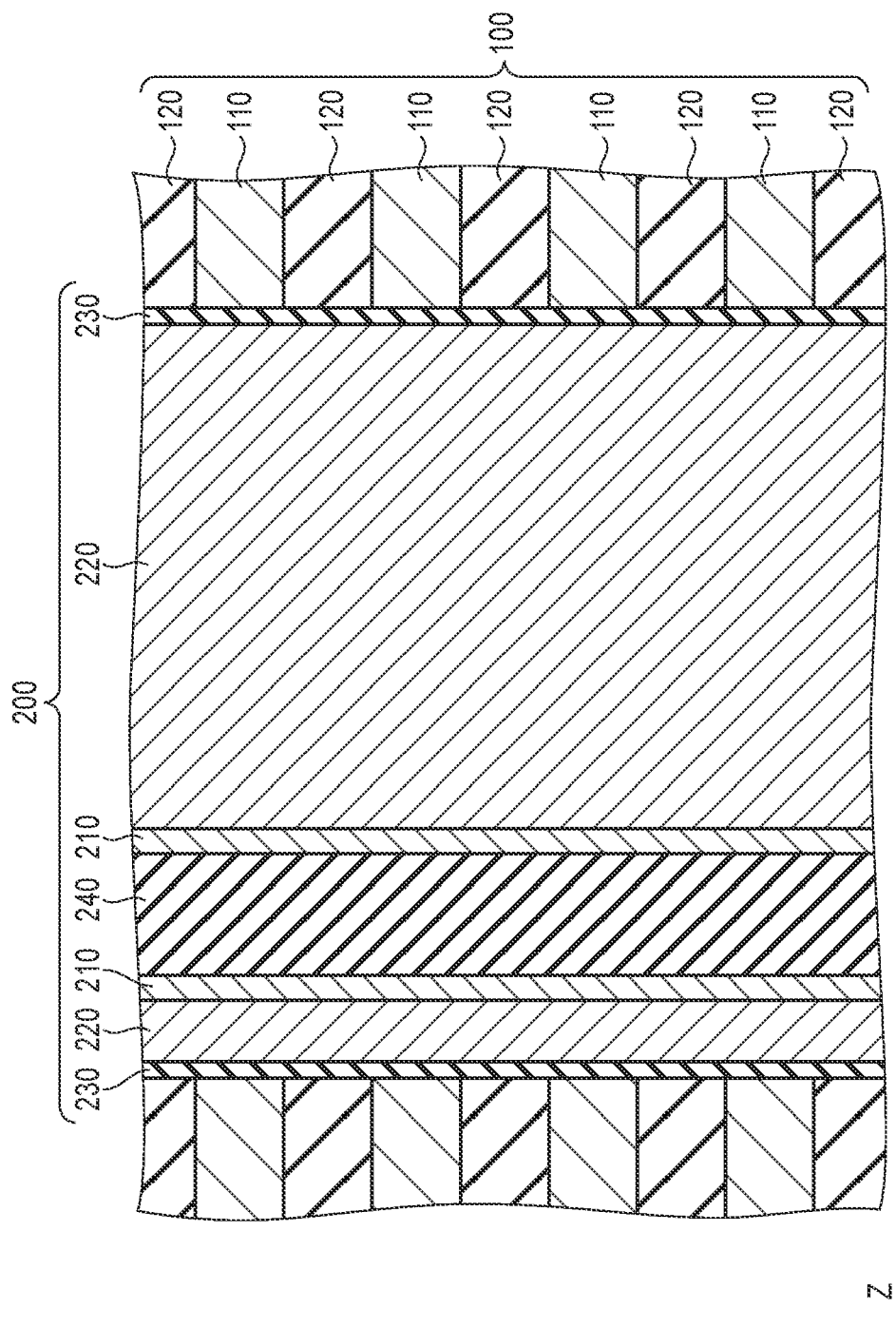
F I G. 5A

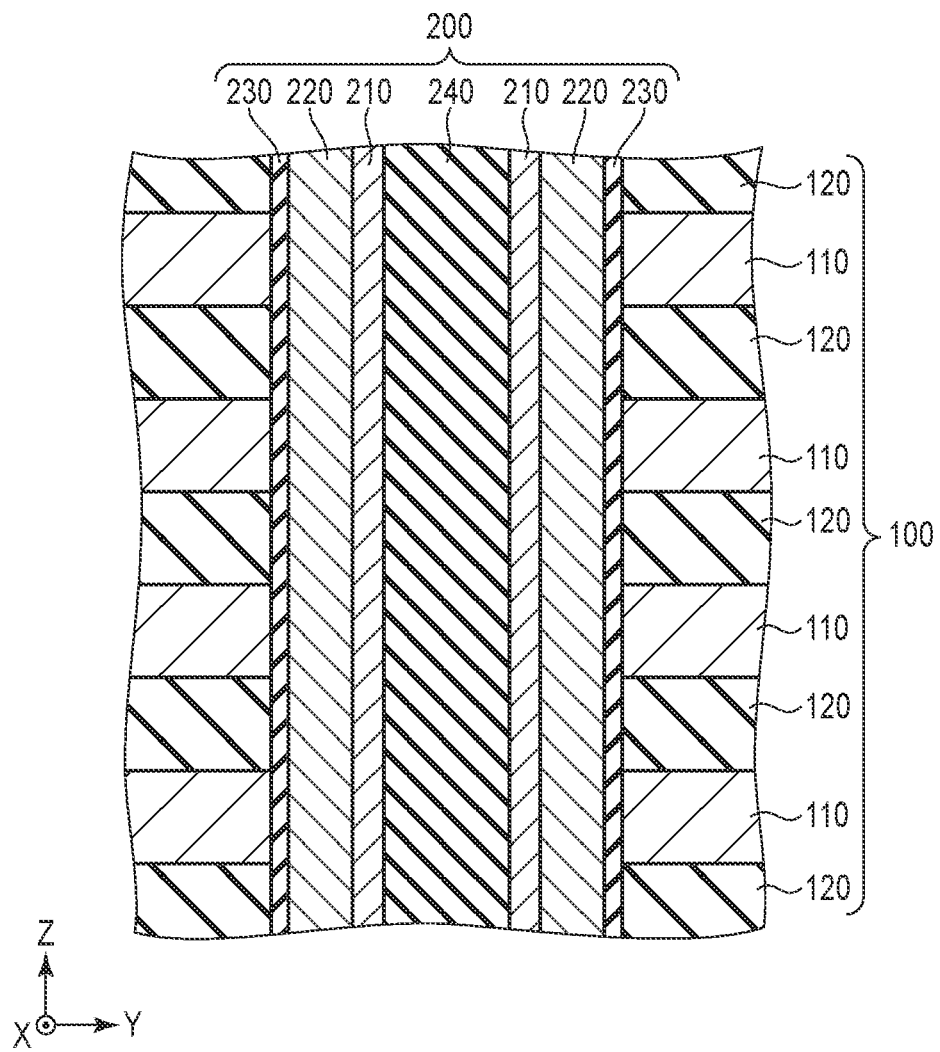
F I G. 5B

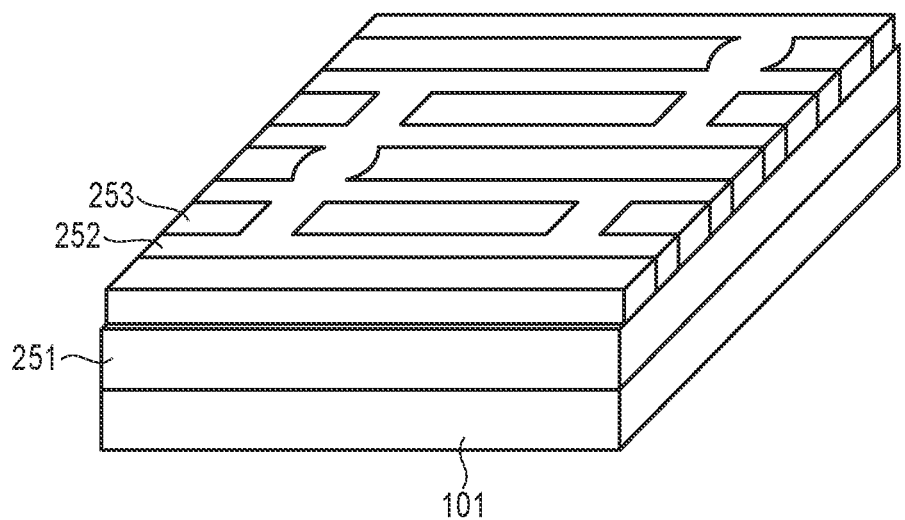
F I G. 11A
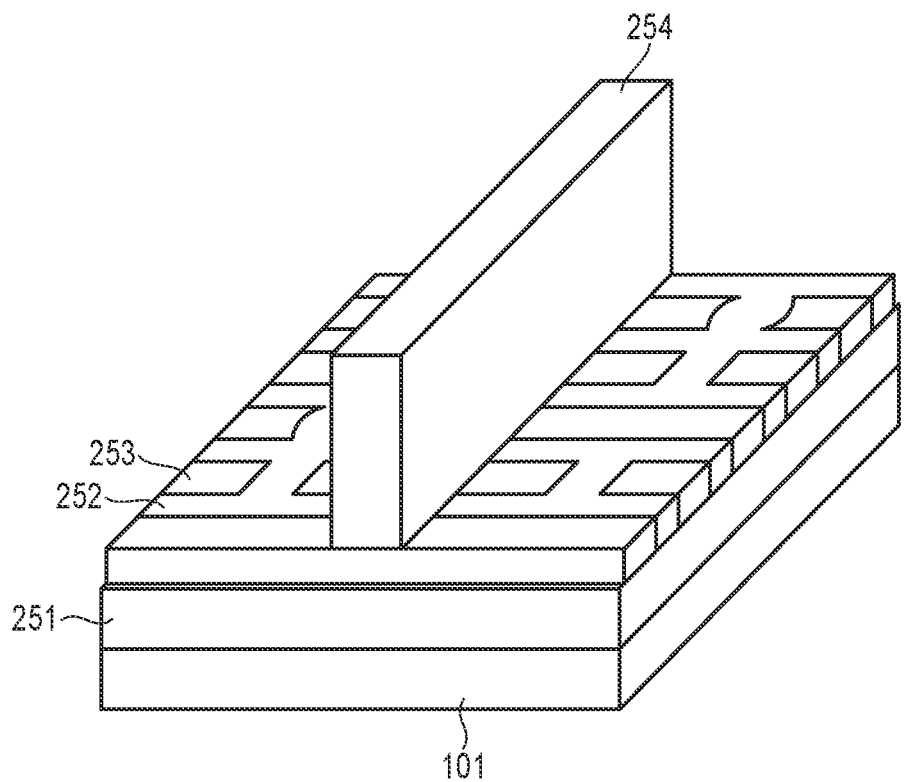
F I G. 11B

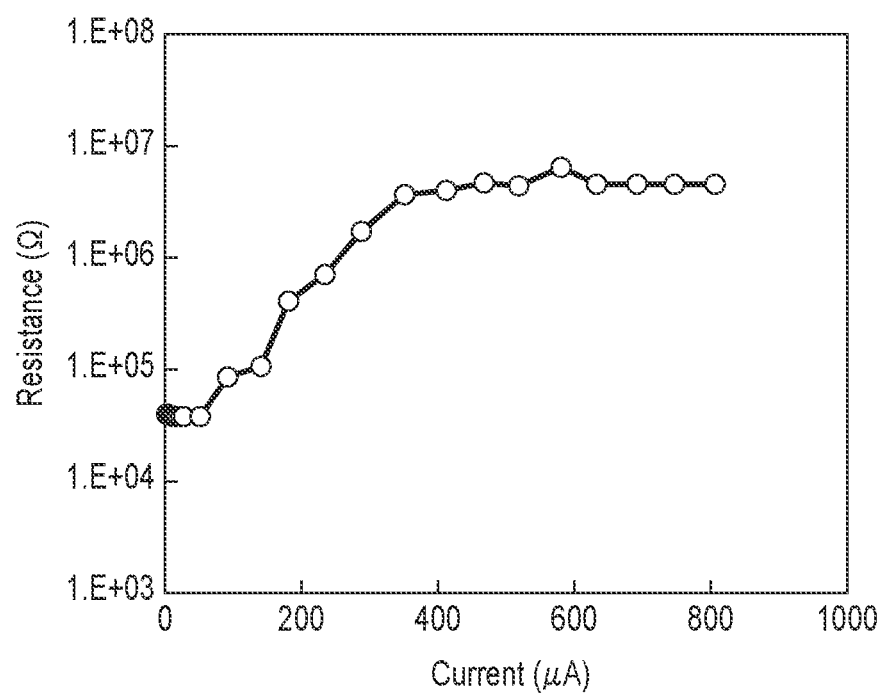
F I G. 23

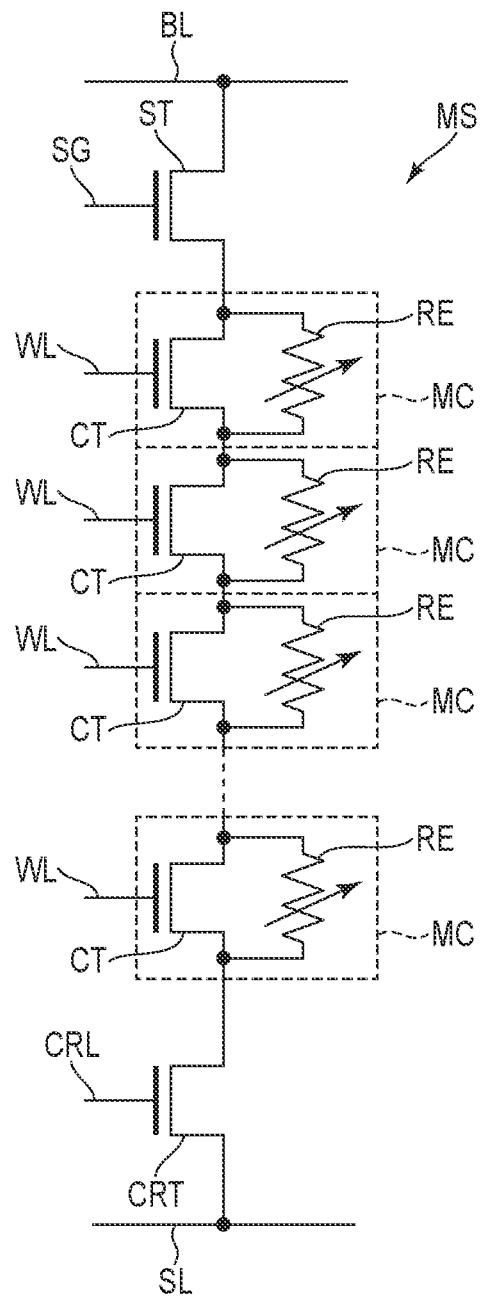
F I G. 27

MEMORY DEVICE

CROSS-REFERENCE TO RELATED APPLICATIONS

This application is based upon and claims the benefit of priority from Japanese Patent Application No. 2021-148550, filed Sep. 13, 2021, the entire contents of which are incorporated herein by reference.

FIELD

Embodiments described herein relate generally to a memory device.

BACKGROUND

A memory device in which a plurality of resistance change memory elements are provided on a semiconductor substrate has been proposed.

BRIEF DESCRIPTION OF THE DRAWINGS

FIG. 4 is a plan view schematically showing a configuration of a first modified example of the memory device according to the first embodiment.

FIG. 5A, FIG. 5B, and FIG. 5C are cross-sectional views taken along lines A-A, B-B, and C-C of FIG. 4, respectively.

FIG. 11A is a perspective view corresponding to FIG. 10A, in relation to a first manufacturing method of the third modified example of the first embodiment.

FIG. 11B is a perspective view corresponding to FIG. 10B, in relation to a first manufacturing method of the third modified example of the first embodiment.

FIG. 23 is a diagram showing resistance change characteristics of a resistance change memory element according to the third embodiment.

FIG. 27 is a circuit diagram showing a configuration of a first modified example of the memory device according to the third embodiment.

DETAILED DESCRIPTION

In general, according to one embodiment, a memory device includes: a stacked structure including a plurality of conductive layers stacked to be apart from each other in a first direction; and a pillar structure including a resistance change portion extending in the first direction in the stacked structure, and a semiconductor portion which extends in the first direction in the stacked structure and which includes a first portion provided along the resistance change portion and a second portion extending from the first portion in at least one direction intersecting the first direction.

Embodiments will be described hereinafter with reference to the accompanying drawings.

First Embodiment

First, a memory device (nonvolatile memory device) according to the first embodiment will be described.

Figure 1:
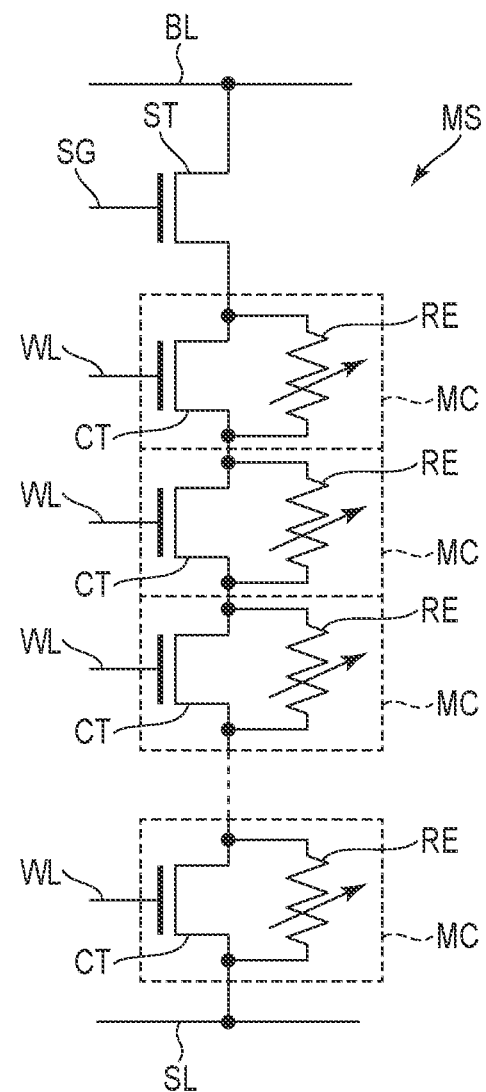
FIG. 1 is a view showing an equivalent circuit of a memory device according to a first embodiment.

FIG. 1 is a diagram showing an equivalent circuit of the memory device according to the embodiment.

As shown in FIG. 1, a memory string MS is connected between a bit line BL and a source line SL, and a plurality of memory strings MS are integrated on a semiconductor substrate (not shown).

Each of the memory strings MS includes a plurality of memory cells MC connected in series and a select transistor ST connected in series to the plurality of memory cells MC. Each memory cell MC includes a structure in which a cell transistor CT and a resistance change memory element RE are connected in parallel to each other. The cell transistors CT and the select transistor ST are formed of MOS transistors. Word lines WL are connected to the plurality of cell transistors CT, respectively. In addition, a select gate line SG is connected to the select transistor ST.

By setting a cell transistor CT included in a desired memory cell MC to an off state and setting cell transistors CT included in memory cells other than the desired memory cell MC to an on state, it is possible to write to and read from the resistance change memory element RE included in the desired memory cell MC. That is, the cell transistor CT functions as a current pass in the memory cells MC other than the desired memory cell MC, and the resistance change memory element RE becomes a current pass in the desired memory cell MC. As a result, a current can be made to flow to the only resistance change memory element RE included in the desired memory cell MC, of the plurality of resistance change memory elements RE, and writing or reading can be performed only to the resistance change memory element RE included in the desired memory cell MC.

In the embodiment, the plurality of memory cells MC described above are stacked in d direction perpendicular to the semiconductor substrate, and the memory string MS is formed by the stacked memory cells MC and the select transistor ST.

Figure 2:
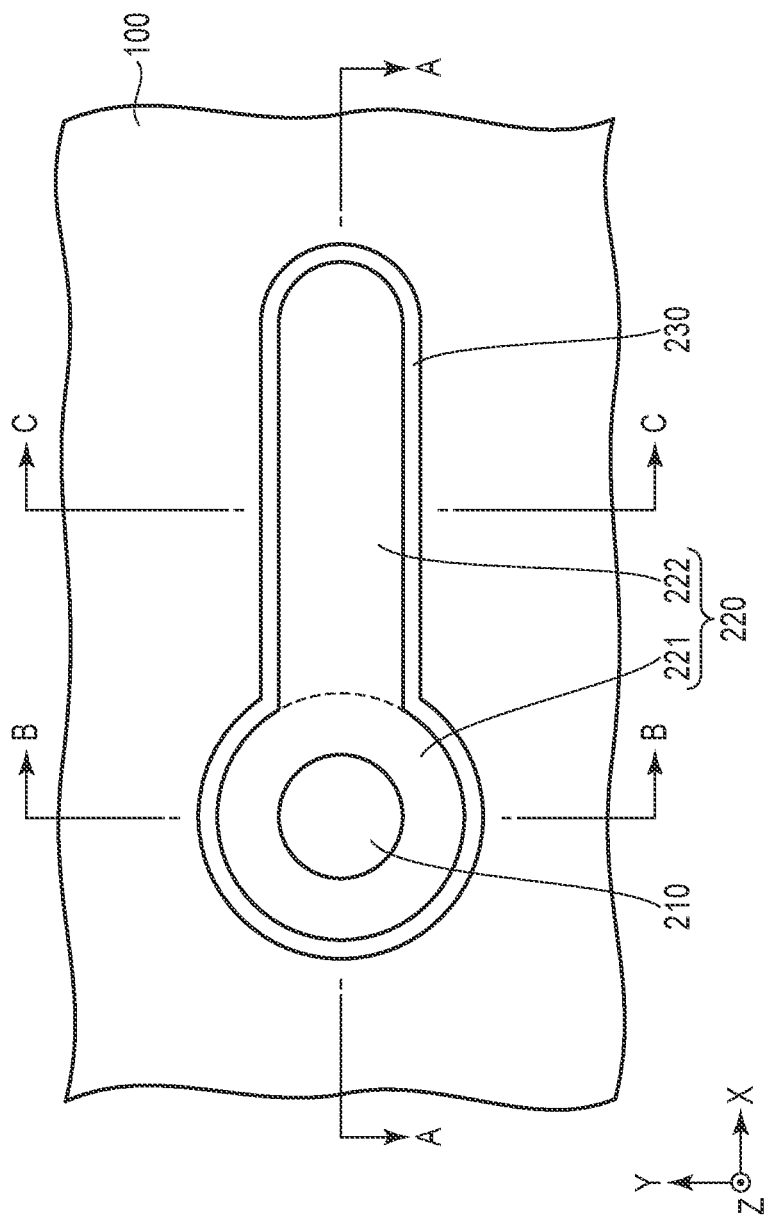
FIG. 2 is a plan view schematically showing a configuration of the memory device according to the first embodiment.
Figure 3A:
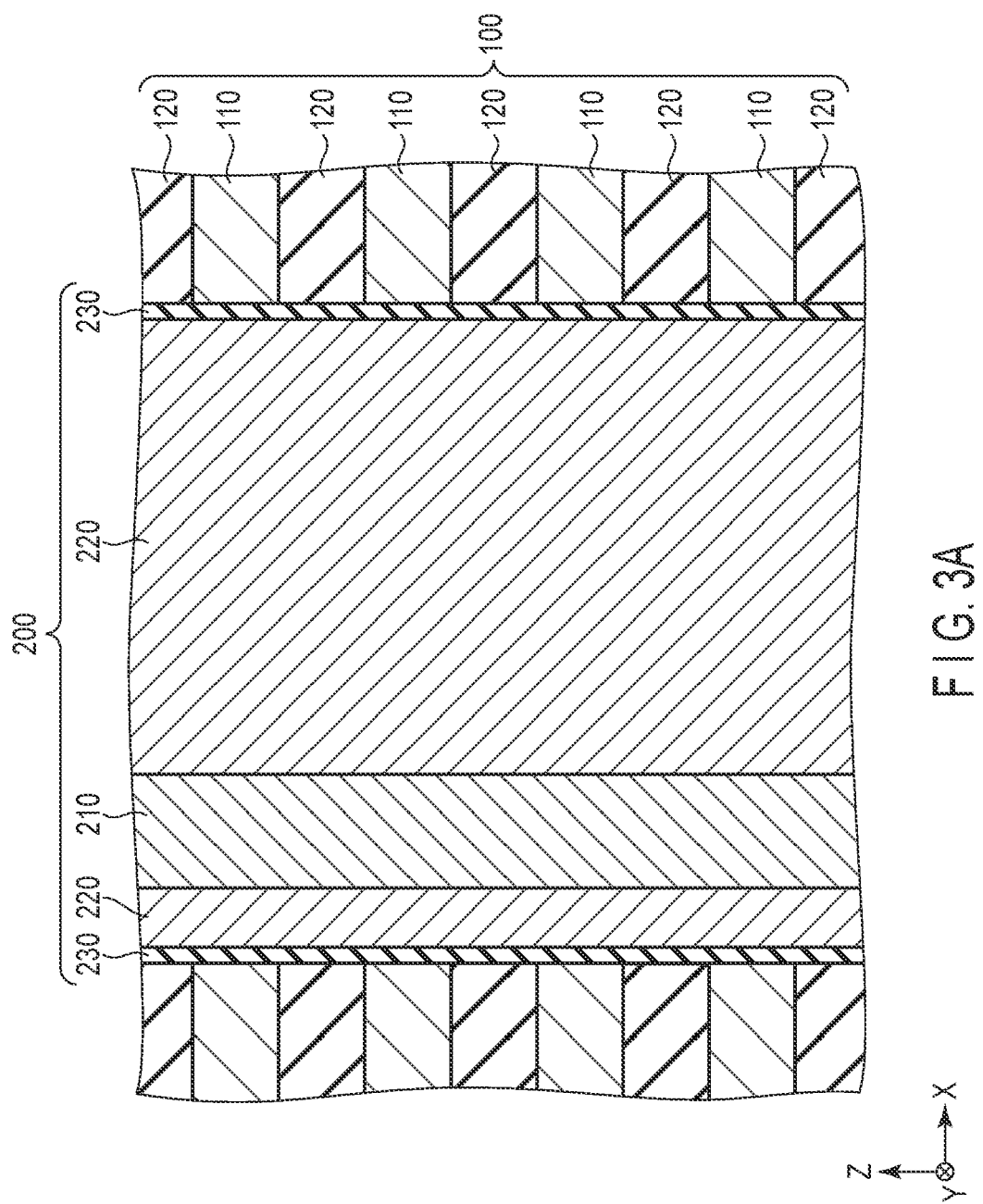
FIG. 3A, FIG. 3B, and FIG. 3C are cross-sectional views taken along lines A-A, B-B, and C-C of FIG. 2, respectively.
Figure 3B:
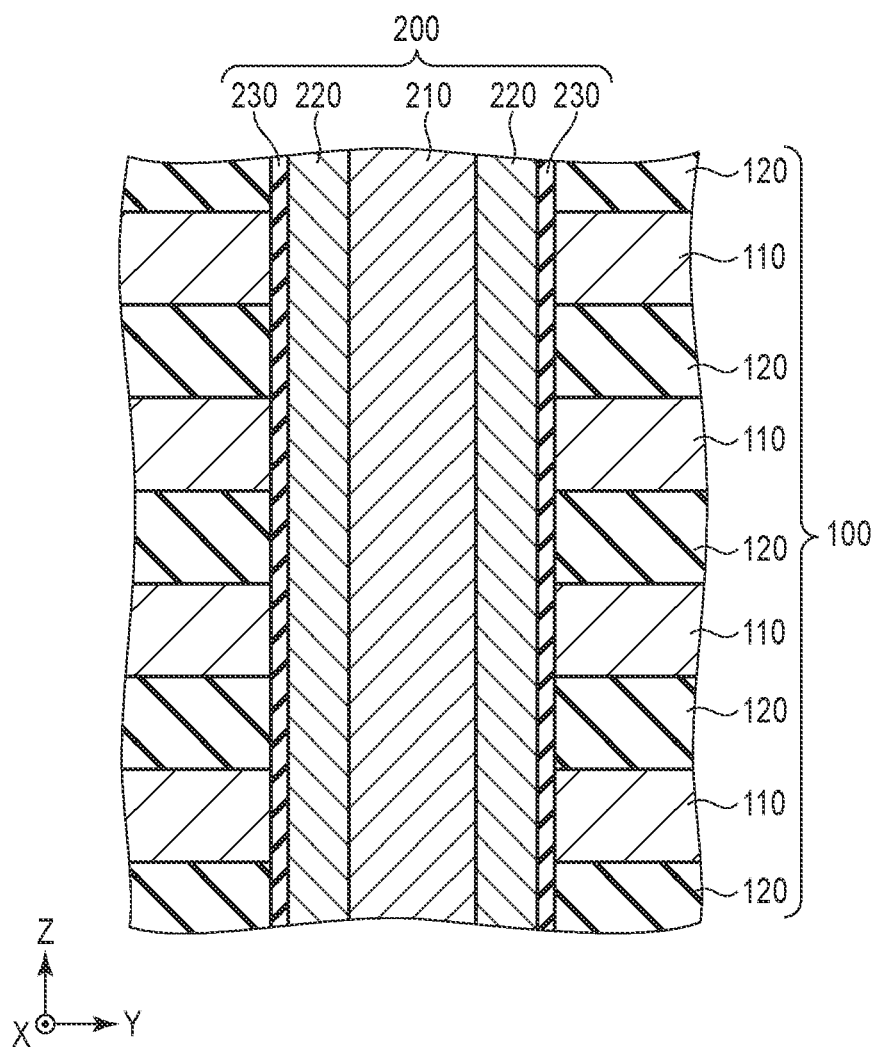
Figure 3C:
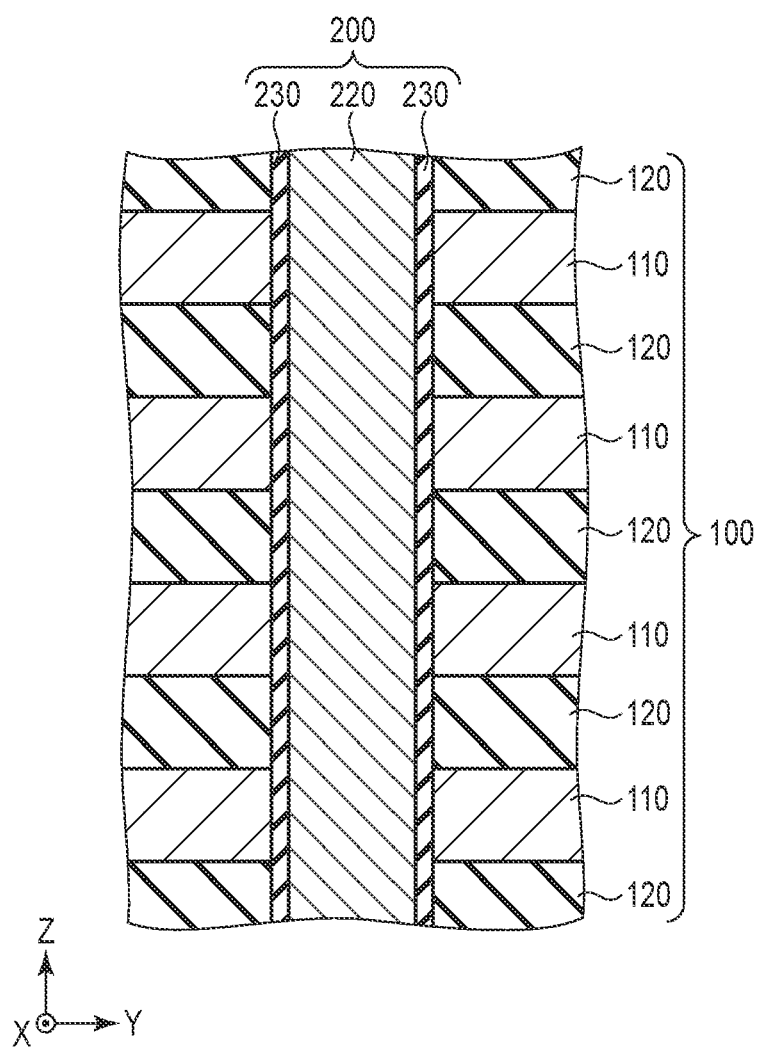

FIG. 2 is a plan view (planar pattern view) schematically showing a configuration of the memory device according to the embodiment. FIG. 3A, FIG. 3B, and FIG. 3C are cross-sectional views taken along lines A-A, B-B, and C-C of FIG. 2, respectively. The X direction, Y direction, and Z direction shown in the figures are directions intersecting each other. More specifically, the X direction, the Y direction, and the Z direction are directions orthogonal to each other.

The memory device of the present embodiment includes a stacked structure 100 and a pillar structure 200.

The stacked structure 100 includes a plurality of conductive layers 110 stacked to be apart from each other in the Z direction. More specifically, the stacked structure 100 is a structure in which a plurality of conductive layers 110 and a plurality of insulating layers 120 are alternately stacked in the Z direction. For example, the conductive layers 110 are formed of a metal material and the insulating layers 120 are formed of an insulating material such as a silicon oxide. Each of the conductive layers 110 and the insulating layers 120 extends parallel to an XY plane perpendicular to the Z direction. The conductive layer 110 functions as a gate electrode of the cell transistor CT, the word line WL, a gate electrode of the select transistor ST, and the select gate line SG, and the insulating layer 120 functions to electrically insulate a part between adjacent conductive layers 110.

The pillar structure 200 extends in the Z direction inside the stacked structure 100 and includes d resistance change portion 210, a semiconductor portion 220, and a first insulating portion 230.

The resistance change portion 210 functions as a nonvolatile resistance change layer (storage layer) of the resistance change memory element RE, has a columnar shape, and extends in the Z direction inside the stacked structure 100. For example, a phase change memory (PCM) material containing germanium (Ge), antimony (Sb), and tellurium (Te) is used for the resistance change portion 210.

The semiconductor portion 220 functions as a channel forming portion of a MOS transistor (cell transistor CT and select transistor ST) and extends in the Z direction inside the stacked structure 100. For example, a semiconductor material such as polysilicon is used for the semiconductor portion 220.

The semiconductor portion 220 includes a first portion 221 and a second portion 222. The first portion 221 is provided along the resistance change portion 210. That is, the first portion 221 is provided around the resistance change portion 210 and is in contact with the resistance change portion 210. In the examples shown in FIG. 2, FIG. 3A, FIG. 3B, and FIG. 3C, the first portion 221 surrounds a side surface of the resistance change portion 210. The second portion 222 is provided contiguously from the first portion 221 and extends in a direction intersecting the Z direction. More specifically, the second portion 222 extends from the first portion 221 in one direction orthogonal to the Z direction and is not in contact with the resistance change portion 210.

The first insulating portion 230 functions as a gate insulating layer of the MOS transistors (cell transistor CT and select transistor ST), extends in the Z direction inside the stacked structure 100, and is provided between the stacked structure 100 and the semiconductor portion 220. The first insulating portion 230 is formed of an insulating material such as a silicon oxide.

As can be understood from the above descriptions, a plurality of cell transistors CT are formed of a plurality of conductive layers 110 functioning as a plurality of gate electrodes, a plurality of portions functioning as a plurality of channel forming portions of the semiconductor portion 220, and a plurality of portions functioning as a plurality of gate insulating layers of the first insulating portion 230. In addition, a plurality of resistance change memory elements RE are formed of a plurality of portions of the resistance change portion 210 provided for the plurality of cell transistors CT included in the plurality of memory cells MC. The memory cell MC is formed of the cell transistor CT and the resistance change memory element RE, and the memory string MS is formed of the plurality of memory cells MC connected in series and the select transistors ST connected in series to the plurality of memory cells MC.

As described above, in the embodiment, the semiconductor portion 220 that functions as the channel forming portion of the cell transistor CT includes a first portion 221 and a second portion 222 that extends continuously from the first portion 221. Thus, since the semiconductor portion 220 includes the second portion 222 extending continuously from the first portion 221, the channel width of the cell transistor CT can be increased as compared with a case where the semiconductor portion 220 includes only the first portion 221. The current flowing through the cell transistor CT can be thereby increased. As a result, in the embodiment, the current flowing through the memory string MS can be increased and the current flowing through the resistance change memory element RE can be increased as described below.

In a resistance change memory element such as a PCM element, a large write current is required to perform a stable write operation. In the memory string MS as shown in FIG. 1, however, a plurality of cell transistors CT included in a plurality of memory cells MC other than the desired memory cell MC are connected in series to the resistance change memory element RE included in the desired memory cell MC (selected memory cell MC). For this reason, if the resistance of the cell transistors CT is large, the current flowing to the resistance change memory element RE is limited by the resistance of the cell transistors CT and performing stable writing to the resistance change memory element RE becomes difficult.

In the embodiment, since the channel width of the cell transistor CT can be increased by the second portion 222 of the semiconductor portion 220, the on-resistance of the cell transistor CT can be decreased and the current flowing to the resistance change memory element RE can be increased. Thus, in the embodiment, the write current flowing to the resistance change memory element RE can be increased and a stable write operation can ne performed.

Figure 5C:
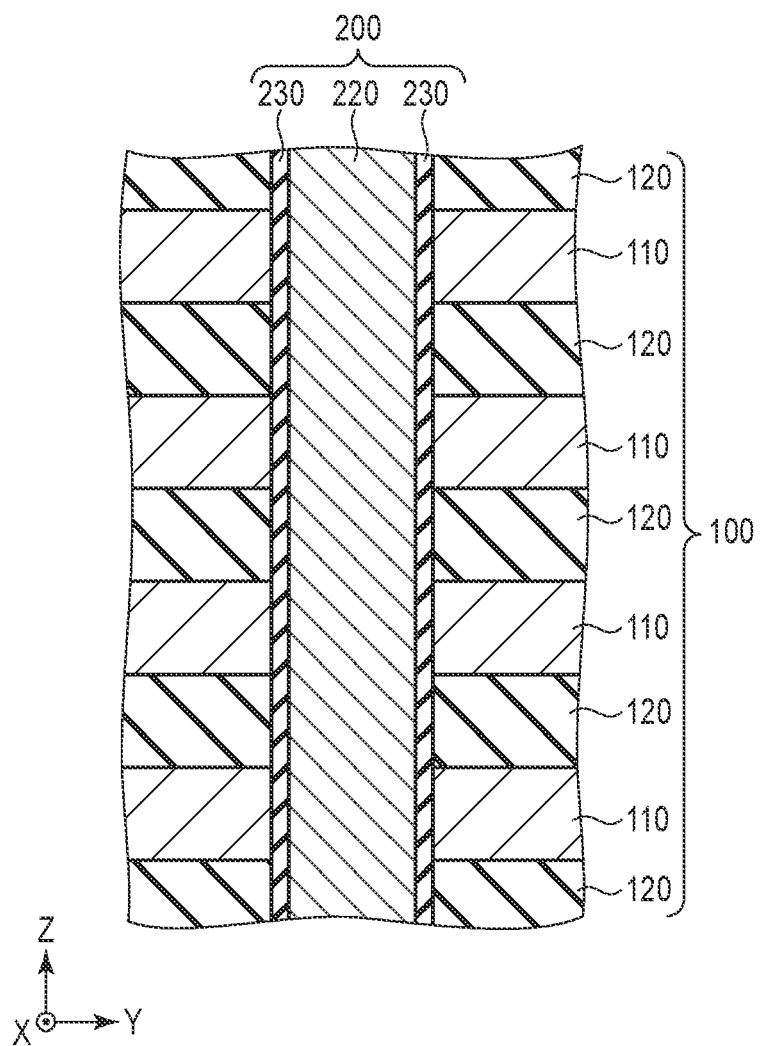

FIG. 4 is a plan view (planar pattern view) schematically showing a configuration of a first modified example of the memory device according to the embodiment. FIG. 5A, FIG. 5B, and FIG. 5C are cross-sectional views taken along lines A-A, B-B, and C-C of FIG. 4, respectively.

In this modified example, the pillar structure 200 further comprises a second insulating portion 240 in addition to the above-described configuration shown in FIG. 2, FIG. 3A, FIG. 3B, and FIG. 3C.

The second insulating portion 240 extends in the Z direction inside the stacked structure 100 and is surrounded by the semiconductor portion 220. In this modified example, the second insulating portion 240 is also surrounded by the resistance change portion 210.

In this modified example, too, the semiconductor portion 220 includes a second portion 222 extending continuously from the first portion 221, similarly to the above-described embodiment. Therefore, in this modified example, too, it is possible to increase the write current flowing to the resistance change memory element RE and to perform a stable write operation, similarly to the above-described embodiment.

Figure 6A:
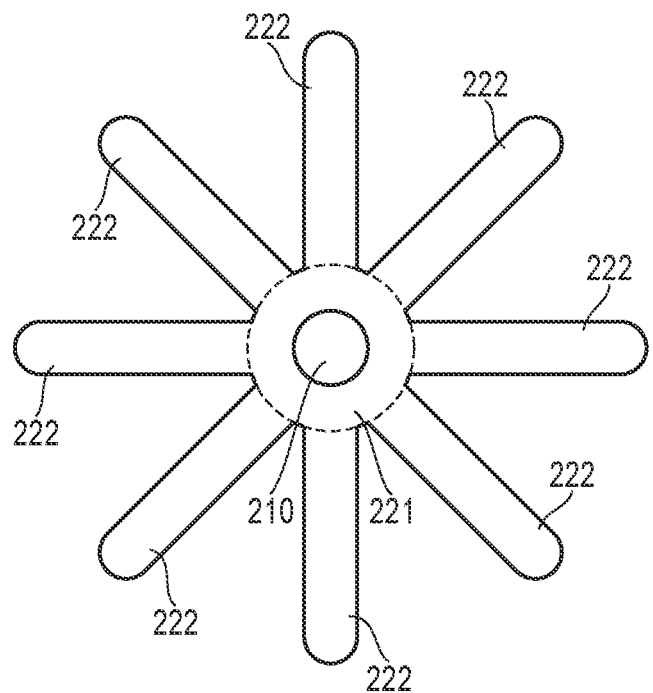
FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, and FIG. 6O are views schematically showing a planar pattern of the memory device according to a second modified example of the first embodiment.
Figure 6B:
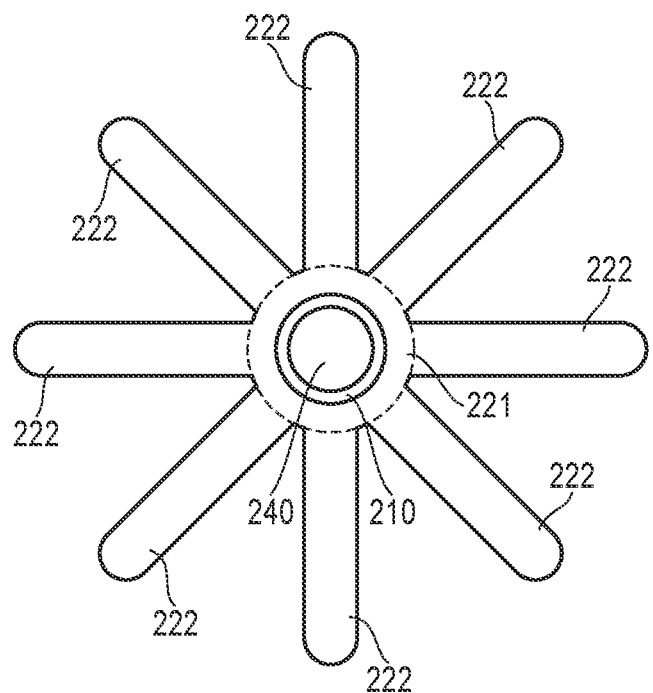
Figure 6C:
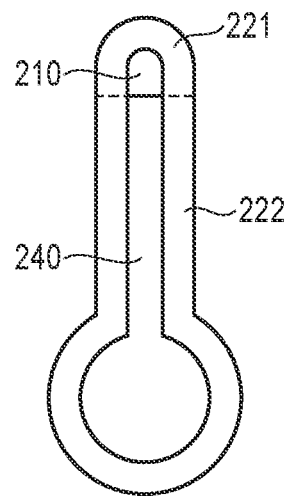
Figure 6D:
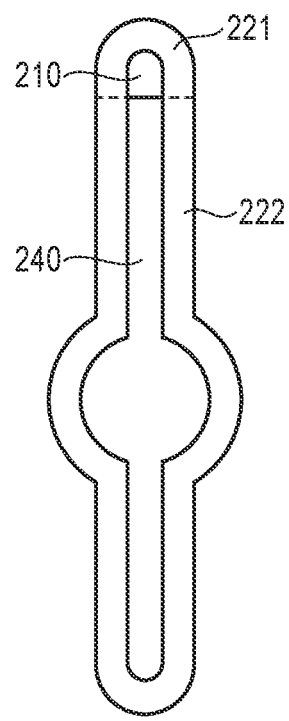
Figure 6E:
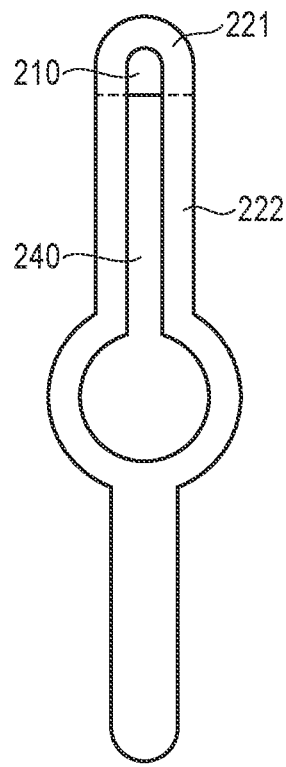
Figure 6F:
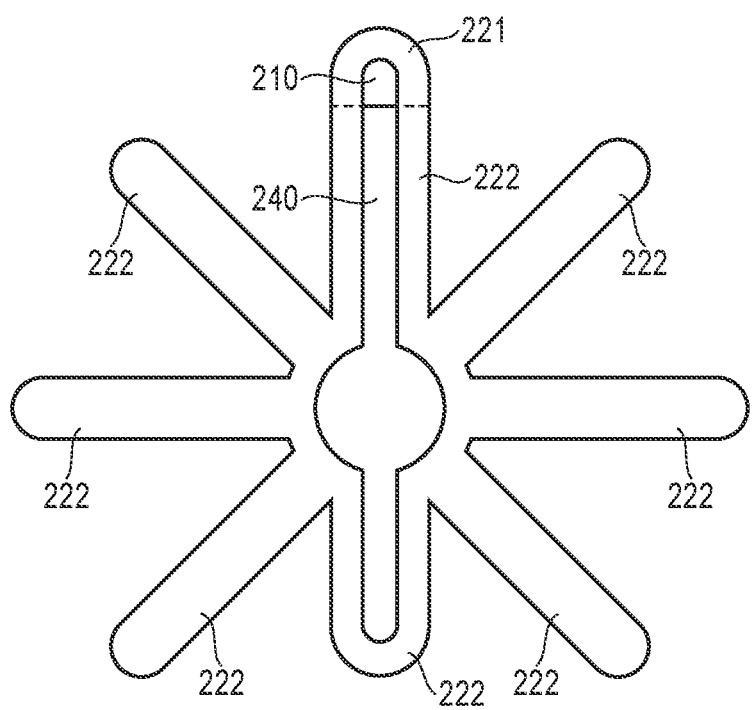
Figure 6G:
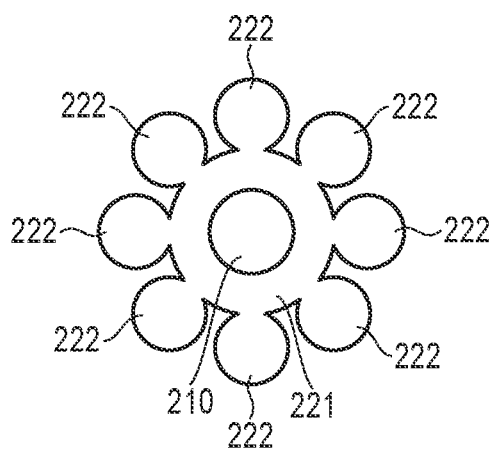
Figure 6I:
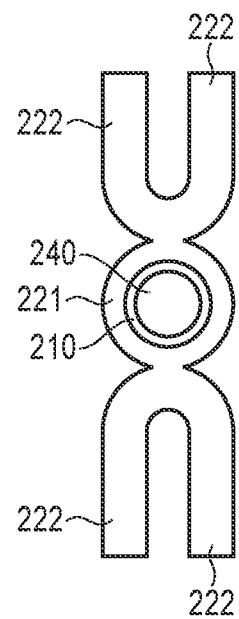
Figure 6H:
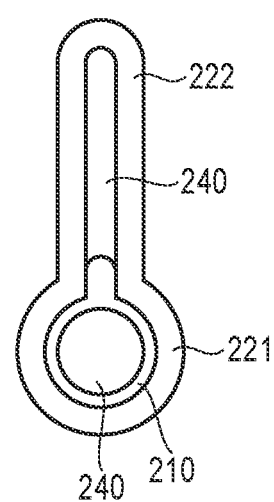
Figure 6J:
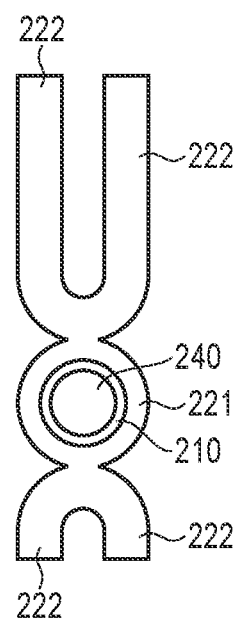
Figure 6K:
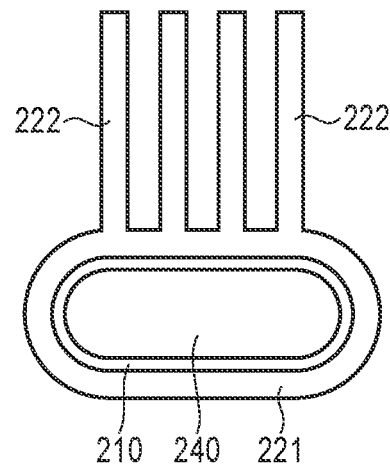
Figure 6L:
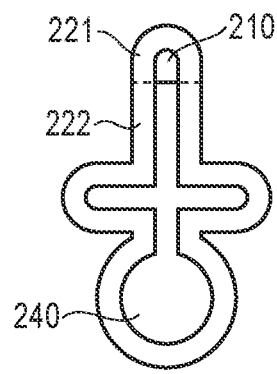
Figure 6M:
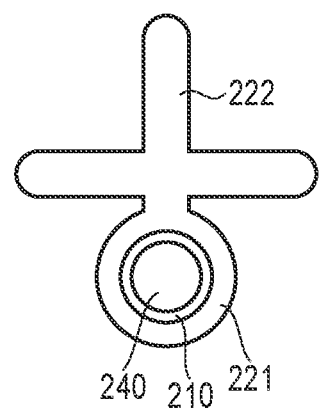
Figure 6N:
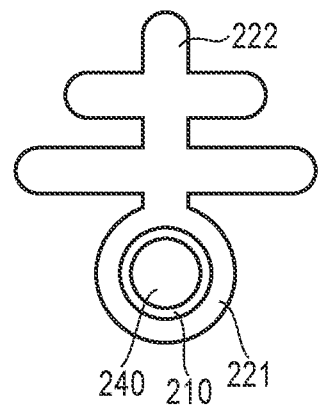
Figure 6O:
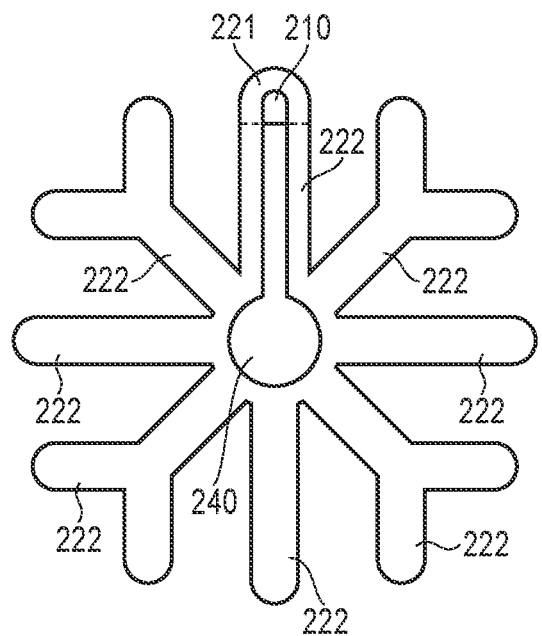

FIG. 6A to FIG. 6O are views schematically showing various planar patterns of the memory device according to the second modified example of the embodiment. In FIG. 6A to FIG. 6O, only the planar patterns of the resistance change portion 210, the semiconductor portion 220, and the second insulating portion 240 included in the pillar structure 200 are shown, and illustration of the first insulating portion 230 is omitted.

In the example shown in each of FIG. 6A and FIG. 6B, the second portions 222 of the semiconductor portion 220 extend from the first portion 221 to d plurality of directions orthogonal to the Z direction. In addition, in the example shown in FIG. 6B, a second insulating portion 240 is provided, and the second insulating portion 240 is surrounded by the resistance change portion 210. In the examples shown in FIG. 6A and FIG. 6B, since the second portions 222 of the semiconductor portion 220 extend in a plurality of directions, the channel width of the cell transistor CT can be further increased and the write current flowing to the resistance change memory element RE can be further increased.

In the examples shown in FIG. 6C, FIG. 6D, FIG. 6E, and FIG. 6F, the resistance change portion 210 is provided so as to correspond to an end part of the semiconductor portion 220, and the first portion 221 of the semiconductor portion 220 is located around the resistance change portion 210. In addition, the second insulating portion 240 extends from the resistance change portion 210 to a direction orthogonal to the Z direction. In the examples shown in FIG. 6C, FIG. 6D, FIG. 6E, and FIG. 6F, the same advantages as those of the above-described embodiment can be obtained.

In the example shown in FIG. 6G, the second portion 222 of the semiconductor portion 220 extends from the first portion 221 to a plurality of directions orthogonal to the Z direction, similarly to the examples shown in FIG. 6A and FIG. 6B. In addition, the second portion 222 has a plurality of circular planar patterns. In the example shown in FIG. 6G, too, the same advantages as those of the above-described embodiment can be obtained.

The examples shown in FIG. 6H to FIG. 6O, respectively, are views further schematically showing various planar patterns, and the same advantages ds those of the above-described embodiment can also be obtained in these examples.

Next, a third modified example of the present embodiment will be described. This modified example relates to a configuration of the memory device in a case where a plurality of pillar structures 200 are arranged.

Figure 7:
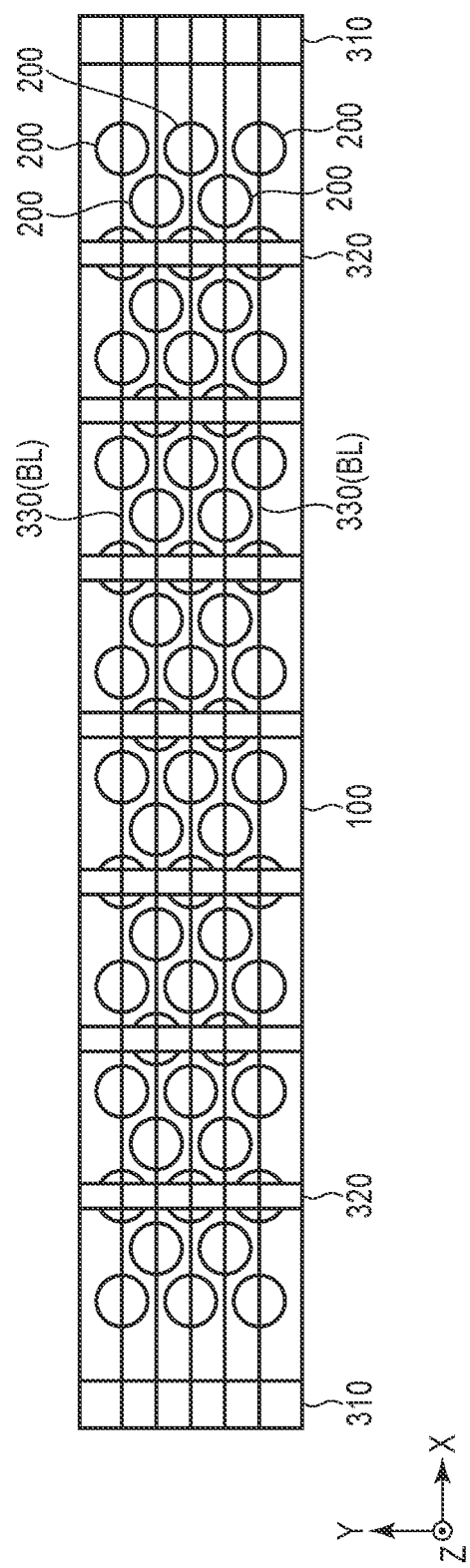
FIG. 7 is a plan view schematically showing a configuration of the memory device according to a third modified example of the first embodiment.

FIG. 7 is a plan view schematically showing a configuration of the memory device according to the modified example. In FIG. 7, the patterns of the pillar structures 200 are illustrated as circles to simplify the descriptions but, in fact, the pillar structures 200 having various patterns as already described or as described below are arranged.

As shown in FIG. 7, the memory device of this modified example includes a plurality of pillar structures 200, a plurality of first partition structures 310, a plurality of second partition structures 320, and a plurality of bit lines (BL) 330.

The plurality of pillar structures 200 are arranged parallel to a plane (XY plane) intersecting the Z direction. More specifically, the plurality of pillar structures 200 are arranged parallel to an XY plane orthogonal to the Z direction.

Each of the plurality of first partition structures 310 extend in the Z direction and the Y direction inside the stacked structure 100. The plurality of memory strings MS based on the plurality of pillar structures 200 are partitioned into a plurality of blocks by the plurality of first partition structures 310.

Each of the plurality of second partition structures 320 extends in the Z direction and the Y direction at an upper part of the stacked structure 100. The plurality of memory strings MS in the same block are partitioned into a plurality of sub-blocks by the plurality of second partition structures 320. As shown in FIG. 1, the memory string MS has a structure in which the select transistor ST is connected in series to the plurality of memory cells MS. The select transistor ST is formed at the upper part of the stacked structure 100 and the upper part of the pillar structure 200. The second partition structure 320 extends in the Z direction to a position between the position where the select transistor ST is formed and the position where the memory cell MS is formed. Therefore, the select transistors ST included in different sub-blocks are electrically isolated by the second partition structure 320.

Each of the plurality of bit lines 330 extends in the X direction and is connected to a corresponding select transistor ST. More specifically, each of the bit lines 330 is connected to one select transistor ST in each sub-block.

With the above-described configuration, writing to or reading from a desired memory cell MS included in a desired memory string MS belonging to a desired sub-block can be performed.

FIG. 6 is a diagram showing a conceptual arrangement of the pillar structures 200 and the second partition structures 320 shown in FIG. 7. Each of the pillar structures 200 is disposed to correspond to an area 201 shaped in a regular hexagon, and these areas 201 in regular hexagons are disposed parallel to the XY plane.

Figure 8:
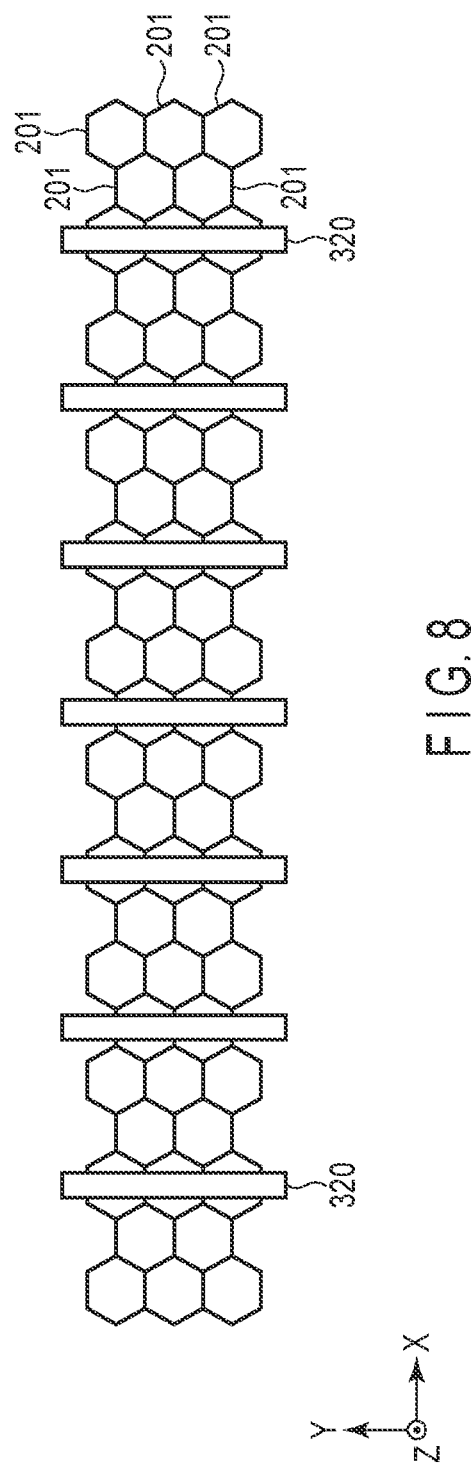
FIG. 8 is a view showing a conceptual arrangement of a pillar structure and a second partition structure shown in FIG. 7, according to the third modified example of the first embodiment.
Figure 9:
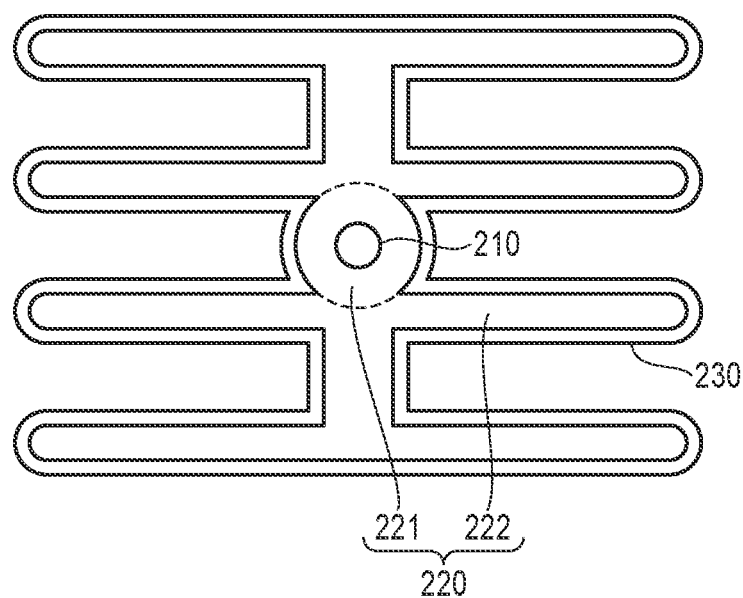
FIG. 9 is a planar pattern view schematically showing a configuration of the pillar structure disposed in an area shaped in a regular hexagon shown in FIG. 8, according to the third modified example of the first embodiment.

FIG. 9 is a planar pattern view schematically showing a configuration of the pillar structures 200 disposed to correspond to the areas 201 of regular hexagons shown in FIG. 8.

In the example of FIG. 9, too, the semiconductor portion 220 also includes the first portion 221 provided around the resistance change portion 210, and the second portion 222 provided continuously from the first portion 221 and extending parallel to the XY plane perpendicular to the Z direction.

FIG. 10A to FIG. 10E are plan views schematically showing a first manufacturing method of the memory device according to the modified example. FIG. 11A and FIG. 11B are perspective views corresponding to FIG. 10A and FIG. 10B, respectively. In the manufacturing method, a method of forming the pillar structure 200 will be mainly indicated.

Figure 10A:
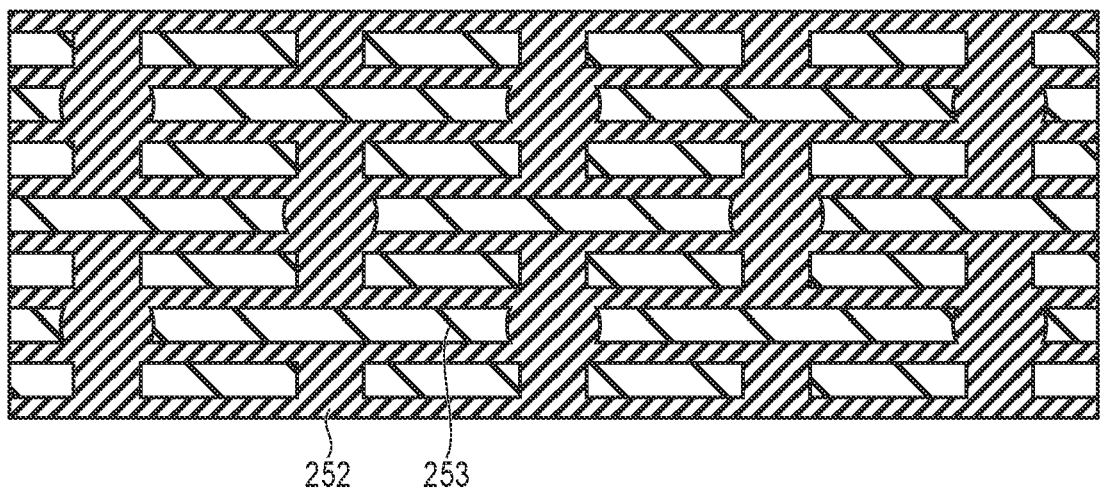
FIG. 10A, FIG. 10B, FIG. 10C, FIG. 10D, and FIG. 10E are plan views schematically showing a first manufacturing method of the memory device according to the third modified example of the first embodiment.

First, as shown in FIG. 10A and FIG. 11A, a silicon nitride layer 251 is formed on the stacked film 101 for forming the stacked structure, and a silicon oxide pattern 252 and an aluminum oxide pattern 253 are formed on the silicon nitride layer 251. The stacked film 101 has a structure in which a plurality of insulating layers and a plurality of sacrificial layers are alternately stacked.

Figure 10B:
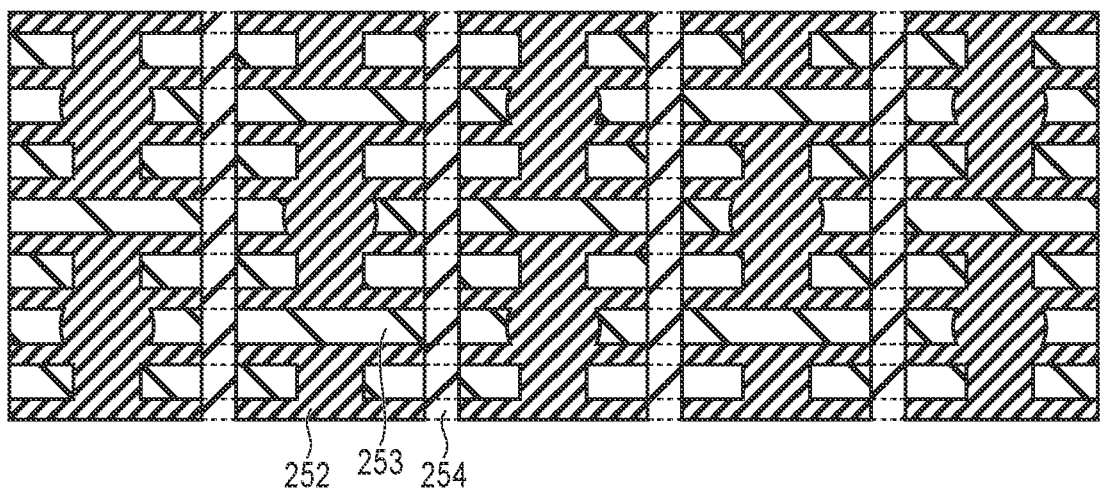

Next, as shown in FIG. 10B and FIG. 11B, a silicon nitride columnar pattern 254 is formed on the structure formed in the process of FIG. 10A.

Figure 10C:
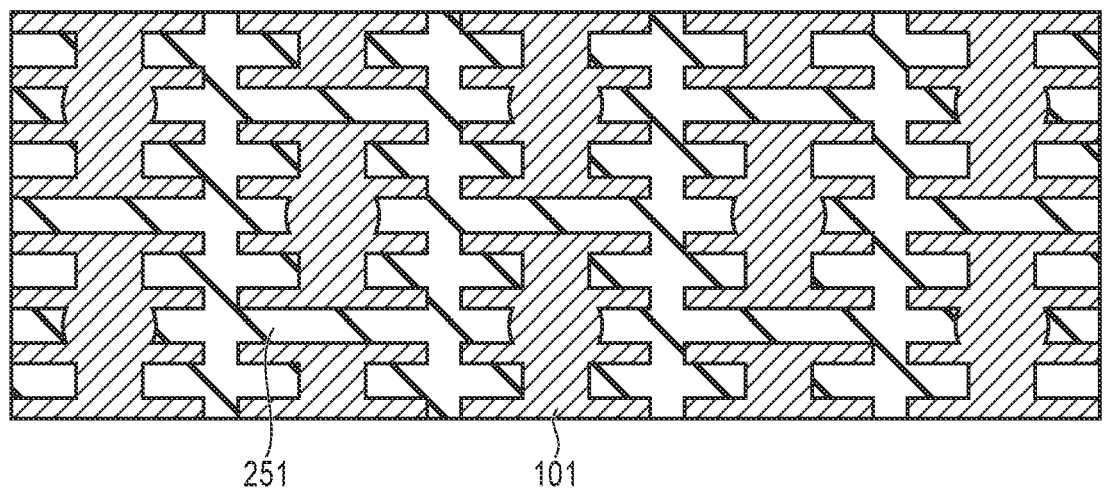

Next, as shown in FIG. 10C, the silicon oxide pattern 252 is etched by using the silicon nitride columnar pattern 254 as a mask. Then, the silicon nitride layer 251 is etched by using the aluminum oxide pattern 253 and the silicon nitride columnar pattern 254 as masks. Furthermore, by removing the aluminum oxide pattern 253, the silicon nitride columnar pattern 254 is also removed and the silicon nitride layer pattern 251 as shown in FIG. 10C is obtained. In addition, the stacked film 101 is exposed.

Figure 10D:
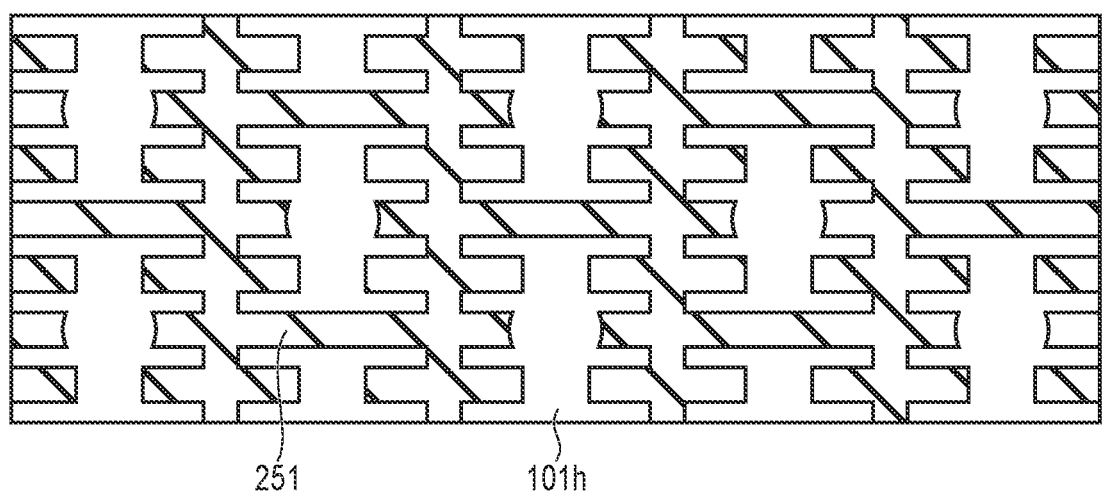

Next, as shown in FIG. 10D, the stacked film 101 is etched by using the silicon nitride layer pattern 251 formed in the process of FIG. 10C as a mask, and a hole pattern 101$h$ is thereby formed on the stacked film 101.

Figure 10E:
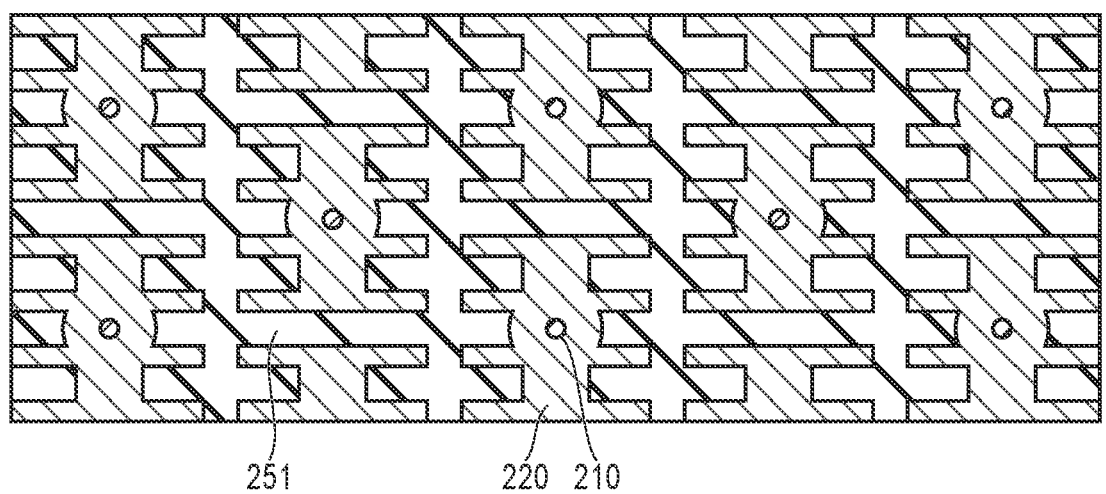

Next, as shown in FIG. 10E, a gate insulating layer (not shown), the semiconductor portion 220, and the resistance change portion 210 are formed in the hole pattern 301$h$.

A subsequent process is not shown, the stacked structure is obtained by replacing the sacrificial layer included in the stacked film 101 with a conductive layer.

FIG. 12A to FIG. 18A are plan views schematically showing a second manufacturing method of the memory device according to the embodiment. FIG. 12B to FIG. 18B are cross-sectional views taken along lines B-B of FIG. 12A to FIG. 18A, respectively. FIG. 12C to FIG. 18C are cross-sectional views taken along lines C-C of FIG. 12A to FIG. 18A, respectively. In the manufacturing method, a method of forming the pillar structure 200 will be mainly indicated.

Figure 12A:
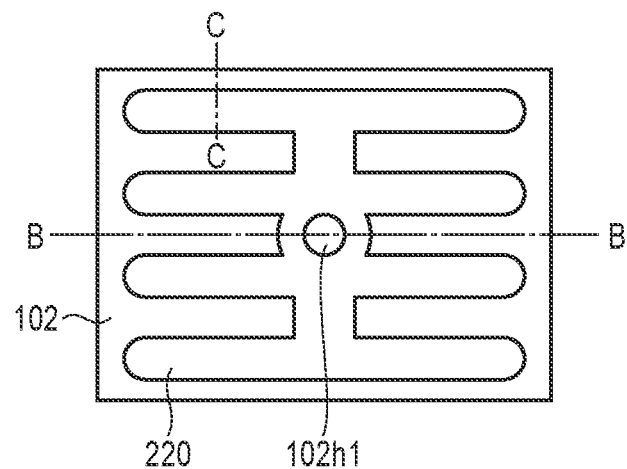
FIG. 12A, FIG. 13A, FIG. 14A, FIG. 15A, FIG. 16A, FIG. 17A, and FIG. 18A are planar views schematically showing a second manufacturing method of the memory device according to the third modified example of the first embodiment.
Figure 12B:
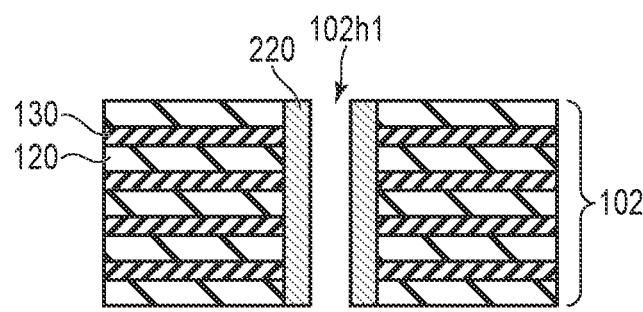
FIG. 12B, FIG. 13B, FIG. 14B, FIG. 15B, FIG. 16B, FIG. 17B, and FIG. 18B are cross-sectional views taken along lines B-B of FIG. 12A, FIG. 13A, FIG. 14A, FIG. 15A, FIG. 16A, FIG. 17A, and FIG. 18A, respectively.
Figure 12C:
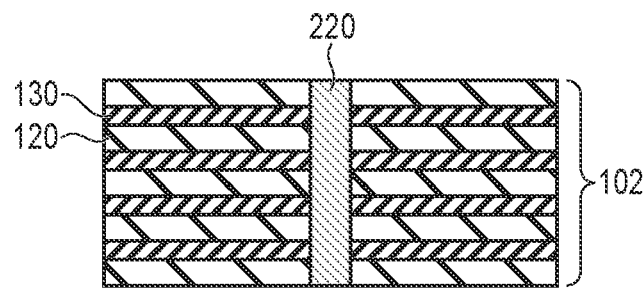
FIG. 12C, FIG. 13C, FIG. 14C, FIG. 15C, FIG. 16C, FIG. 17C, and FIG. 18C are cross-sectional views taken along lines C-C of FIG. 12A, FIG. 13A, FIG. 14A, FIG. 15A, FIG. 16A, FIG. 17A, and FIG. 18A, respectively.

First, as shown in FIG. 12A, FIG. 12B, and FIG. 12C, the semiconductor portion 220 is formed in a hole formed in the stacked film 102 for forming the stacked structure. At this time, the hole 102$h$1 is made to remain in the semiconductor portion 220. The stacked film 102 has a structure in which d plurality of insulating layers 120 and a plurality of sacrificial layers 130 are alternately stacked. Silicon oxide is used for the insulating layers 120, and silicon nitride is used for the sacrificial layers 130.

Figure 13A:
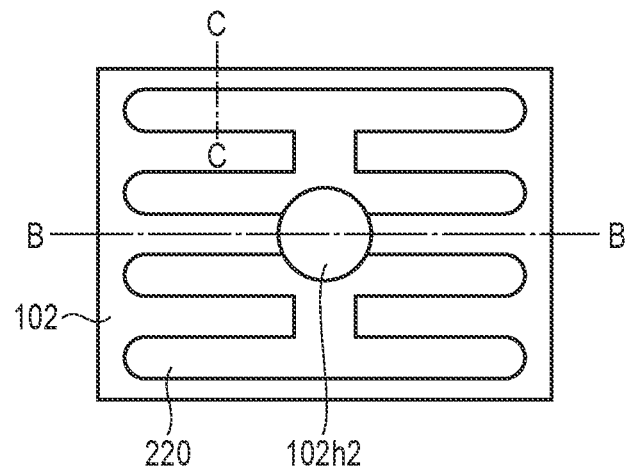
Figure 13B:
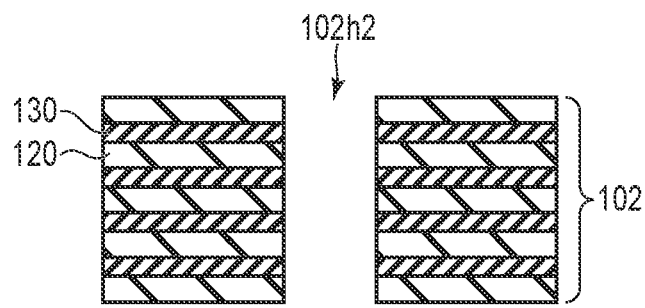
Figure 13C:
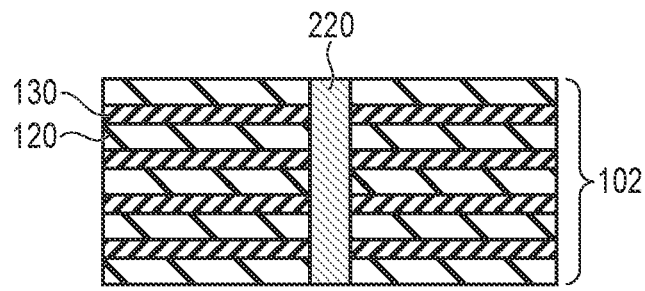

Next, as shown in FIG. 13A, FIG. 13B, and FIG. 13C, the semiconductor portion 220 is etched to enlarge a hole 102$h$1 and form a hole 102$h$2.

Figure 14A:
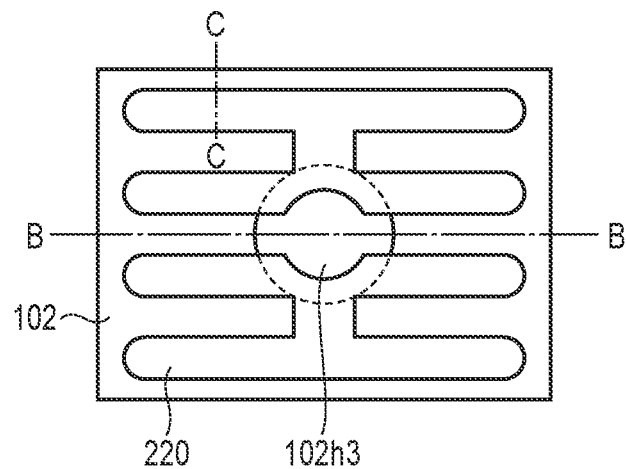
Figure 14B:
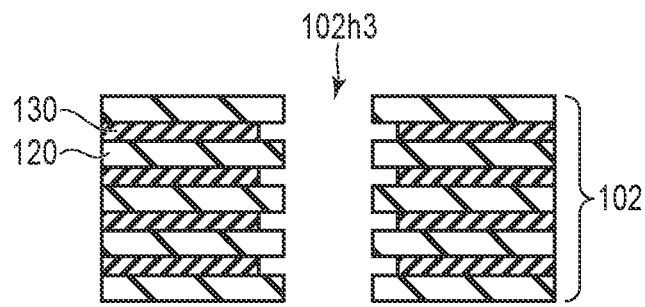
Figure 14C:
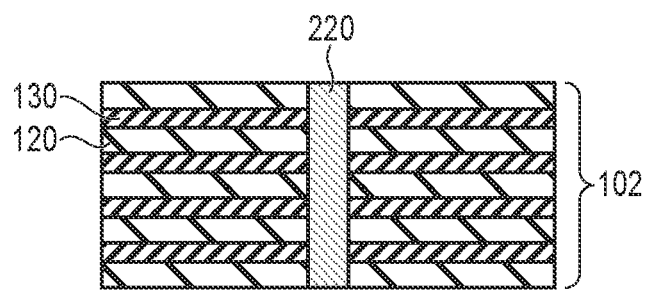

Next, as shown in FIG. 14A, FIG. 14B, and FIG. 14C, the sacrificial layers 130 are selectively etched to recess the sacrificial layers 130 and form a hole 102$h$3.

Figure 15A:
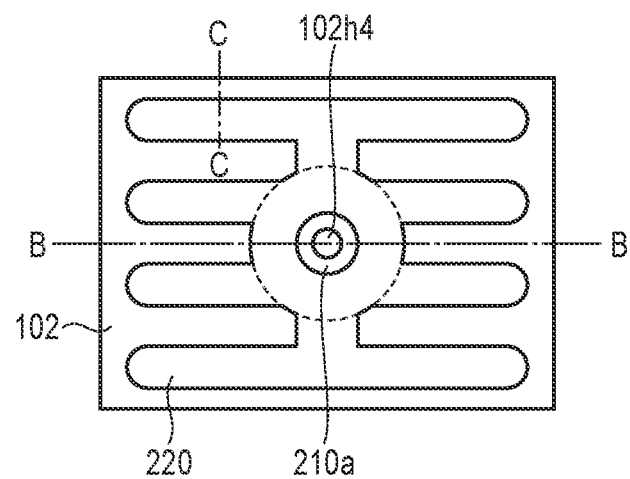
Figure 15B:
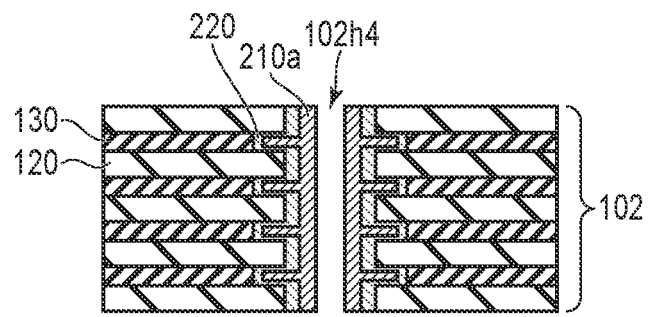
Figure 15C:
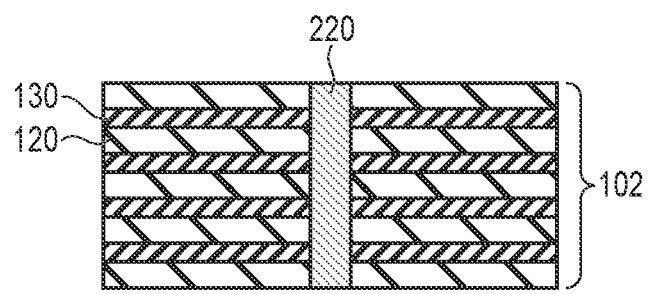

Next, as shown in FIG. 15A, FIG. 15B, and FIG. 15C, the semiconductor portion 220 is newly formed in the hole 102$h$3 and a layer 210$a$ for the resistance change portion is further formed. A hole 102$h$4 is thereby obtained.

Figure 16A:
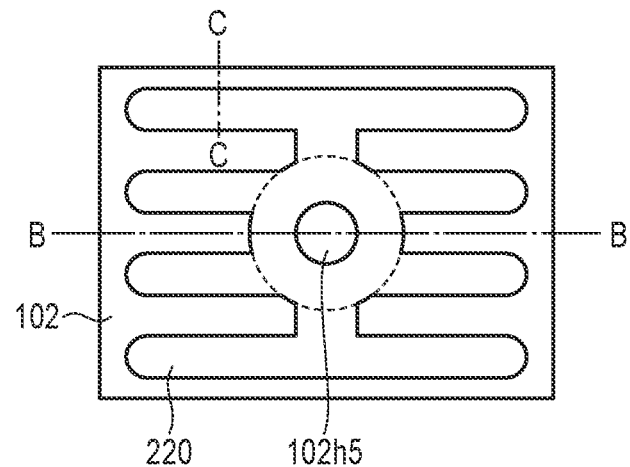
Figure 16B:
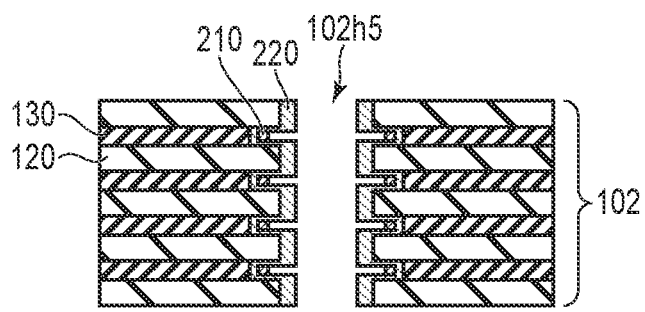
Figure 16C:
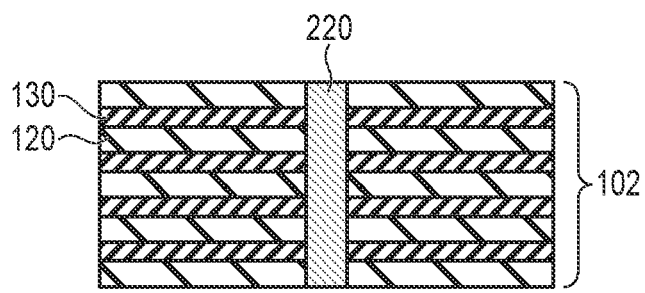

Next, as shown in FIG. 16A, FIG. 16B, and FIG. 16C, the layer 210$a$ for the resistance change portion is etched, and the resistance change portion 210 is left a near side surface of the sacrificial layers 130. A hole 102$h$5 is thereby obtained.

Figure 17A:
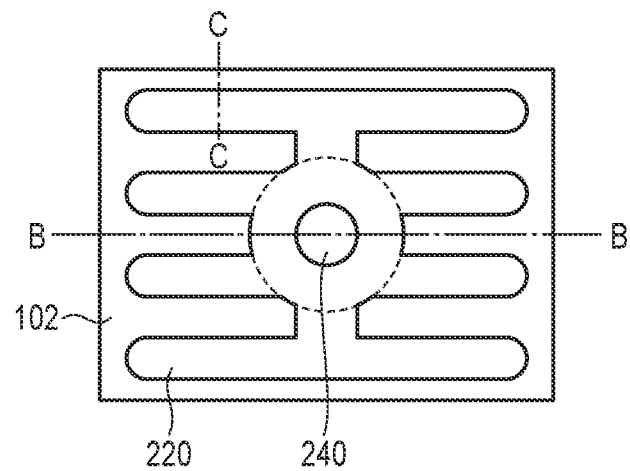
Figure 17B:
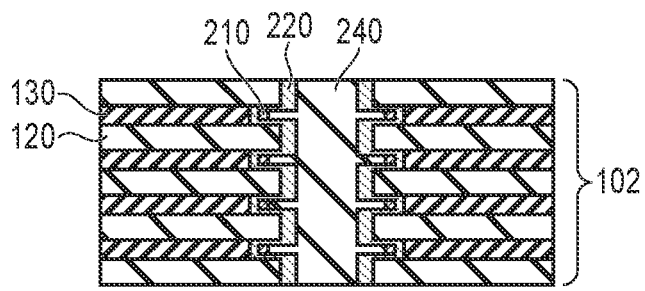
Figure 17C:
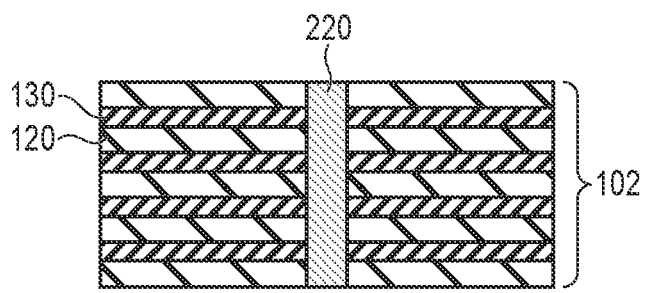

Next, as shown in FIG. 17A, FIG. 17B, and FIG. 17C, an insulating portion 240 is formed in the hole 102$h$5.

Figure 18A:
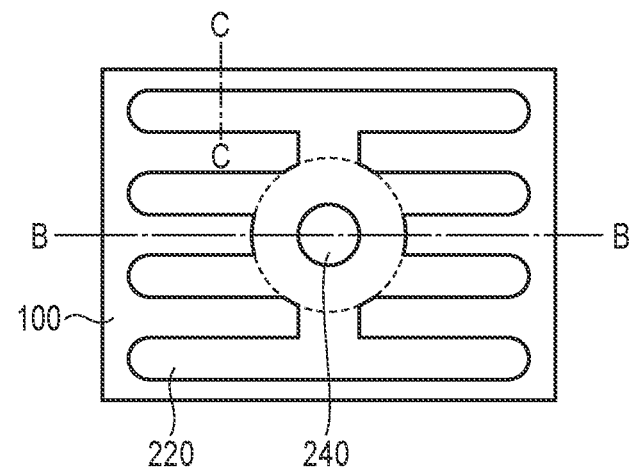
Figure 18B:
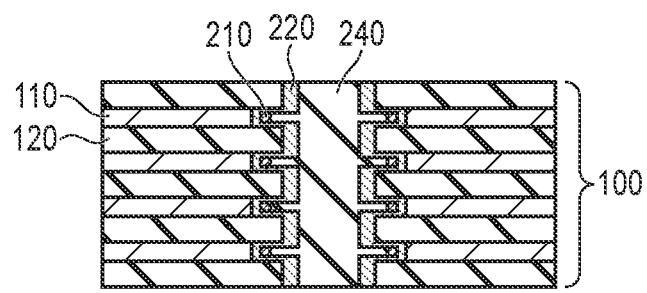
Figure 18C:
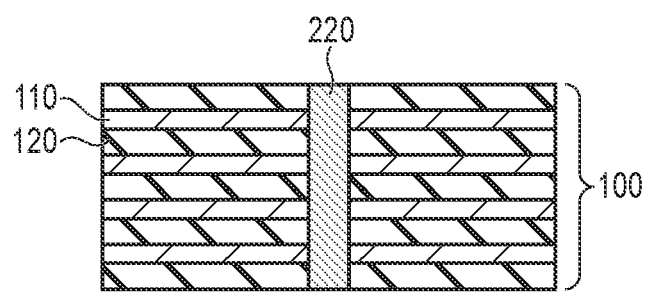

Next, as shown in FIG. 18A, FIG. 18B, and FIG. 18C, the stacked structure 100 is obtained by replacing the sacrificial layers 130 with the conductive layers 110.

In the modified example, too, the basic structure is the same as that of the above-described embodiment, and the same advantages as those of the above-described embodiment can be obtained.

Second Embodiment

Next, a memory device (nonvolatile memory device) according to the second embodiment will be described. Basic elements are the same as those of the first embodiment, and descriptions of the elements described in the first embodiment will be omitted.

Figure 19:
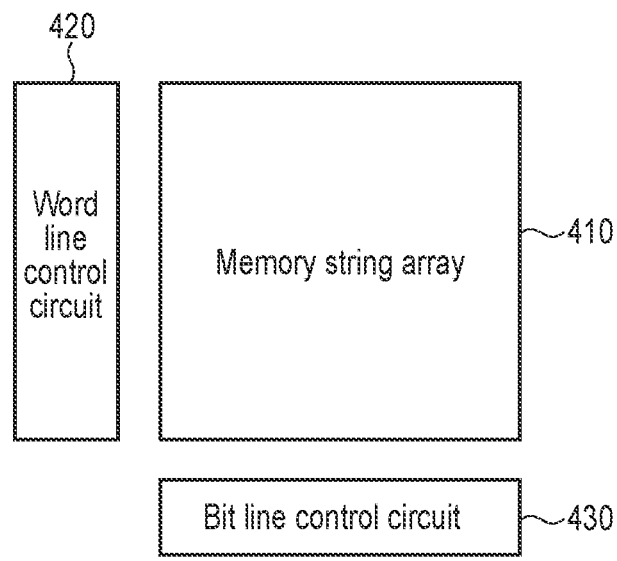
FIG. 19 is a block diagram showing an entire configuration of a memory device according to a second embodiment.

FIG. 19 is a block diagram showing an entire configuration of the memory device according to the embodiment.

As shown in FIG. 19, the memory device comprises a memory string array 410, a word line control circuit 420, and a bit line control circuit 430.

The memory string array 41C includes a plurality of memory strings MS described in the first embodiment, which are arranged in an array.

The word line control circuit 420 controls the plurality of word lines WL described in the first embodiment. That is, the cell transistors CT are controlled to be in an on state or an off state by supplying control signals from the word line control circuit 420 to the word lines WL. The word line control circuit 420 also includes a select transistor control circuit for controlling the on/off state of the select transistor ST described in the first embodiment.

The bit line control circuit 430 controls a plurality of bit lines BL described in the first embodiment. The bit line control circuit 430 also includes a read circuit for reading a resistance state set (stored) in the resistance change memory element RE.

Next, the operation performed when setting a desired resistance state to a desired resistance change storage device RE by the control circuit including the word line control circuit 420 and the bit line control circuit 430 will be described. That is, the operation performed when writing to a desired memory cell MC including the desired resistance change memory element RE will be described.

Figure 20:
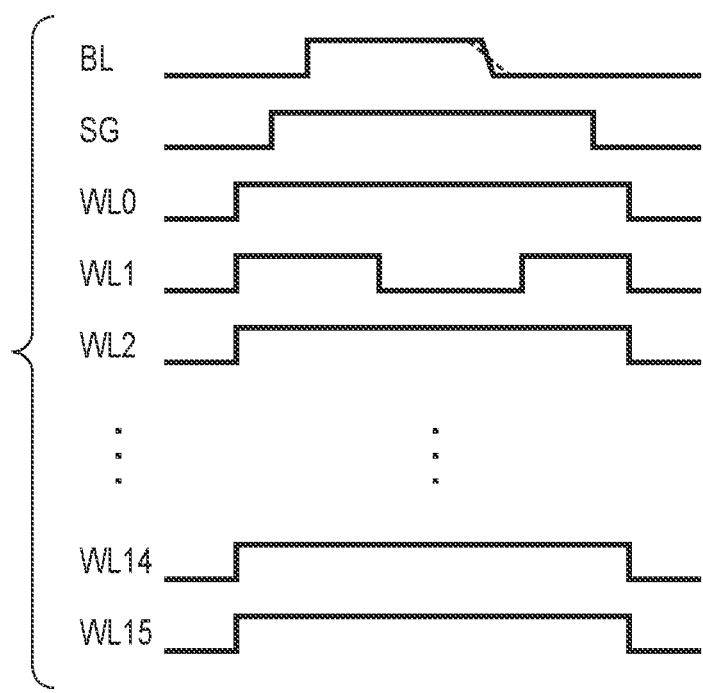
FIG. 20 is a timing chart showing an operation performed when setting a desired resistance state for a desired resistance change memory element, according to the second embodiment.

FIG. 20 is a timing chart showing the operation performed when setting a desired resistance state to a desired resistance change memory element RE. The horizontal axis indicates time and the vertical axis indicates a voltage.

First, the voltages of the word lines WL0 to WL15 are set to a high level, and the cell transistors CT connected to the word lines WL0 to WL15 are set to an on state. Then, the voltage of the select gate line SG is set to the high level, and the select transistor ST connected to the select gate line SG is set to the on state. Furthermore, a write voltage is applied to the bit line BL. This enables a current to be supplied from the bit line BL to the memory string MS.

After that, a desired resistance state (low resistance state or high resistance state) is set to the desired resistance change memory element RE. That is, writing is performed to the desired memory cell MC including the desired resistance change memory element RE and the desired cell transistor CT. In the example shown in FIG. 20, the cell transistor CT connected to the word line W1 is the desired cell transistor.

More specifically, the desired cell transistor CT provided for the desired resistance change memory element RE (i.e., the cell transistor CT included in the desired memory cell MS including the desired resistance change memory element RE) is set to an off state, and the cell transistors CT other than the desired cell transistor CT are set to an on state. Thus, in the desired memory cell MC, the resistance value of the resistance change memory element RE becomes lower than that of the cell transistor CT, and the resistance change memory element RE functions as a current path. In contrast, in the memory cells MC other than the desired memory cell MC, since the resistance value of the cell transistor CT is lower than that of the resistance change memory element RE, the cell transistor CT functions as a current path.

Therefore, a current flows only to the desired resistance change memory element RE of the plurality of resistance change memory elements RE included in the memory string MS. As a result, writing can be performed only to the desired memory cell MC in which the desired resistance change memory element RE is included.

When setting a high resistance state to the desired resistance change memory element RE, the voltage of the bit line BL is made to abruptly fall. Thus, the PCM material contained in the desired resistance change memory element RE becomes amorphous and a high resistance state is obtained. When a low resistance state is set to the desired resistance change memory element RE, the voltage of the bit line BL is made to gradually fall. Thus, the PCM material contained in the desired resistance change memory element RE becomes a crystalline state and a low resistance state is obtained.

As understood from the descriptions of the first embodiment, the resistance change portion (resistance change layer) 210 included in the memory string MS is extended continuously. That is, the resistance change portion 210 also exists in the area between adjacent memory cells MC. For this reason, when writing to the desired resistance change memory element RE (setting a desired resistance state) is performed, there is a risk that writing may also be erroneously performed to a resistance change memory element RE adjacent to the desired resistance change memory element RE. In the embodiment, an initialization method to be described below is applied to the memory string MS to suppress such a problem.

Figure 21:
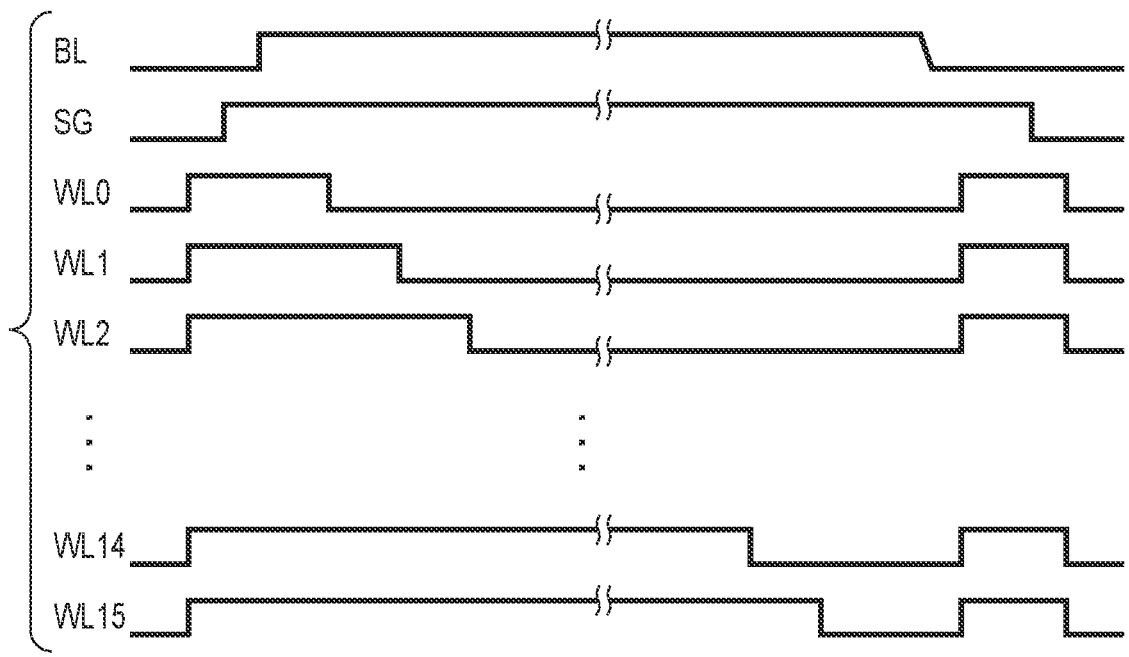
FIG. 21 is a timing chart showing an operation performed when performing initialization of a memory string, according to the second embodiment.

FIG. 21 is a timing chart showing the operation performed when initialization is performed on the memory string MS. The horizontal axis indicates time and the vertical axis indicates a voltage.

First, the voltages of the word lines WL0 to WL15 are set to a high level, and the cell transistors CT connected to the word lines WL0 to WL15 are set to an on state. Then, the voltage of the select gate line SG is set to the high level, and the select transistor ST connected to the select gate line SG is set to the on state. Furthermore, a predetermined voltage is applied to the bit line BL. This enables a current to be supplied from the bit line BL to the memory string MS.

Next, the plurality of cell transistors CT are changed from the on state to the off state in order from one end side of the memory string MS to the other end side. More specifically, the voltage of the word line WL0 is first shifted from the high level to the low level. The cell transistor CT connected to the word line WL0 is thereby shifted from the on state to the off state. Then, the voltage of the word line WL1 is shifted from the high level to the low level while the voltage of the word line WL0 is maintained at the low level. The cell transistor CT connected to the word line WL1 is thereby shifted from the on state to the off state.

After that, the voltages of the word lines WL2 Lo WL15 are changed in this order, from the high level to the low level, in the same manner, while the voltage of the preceding word line WL is maintained at the low level. The cell transistors CT connected to the word lines WL2 to WL15 are thereby changed in this order, from the on state to the off state. Finally, all the cell transistors CT connected to the word lines WL0 to WL15 are set to the off state. The resistance change memory elements RE are thereby set as the current paths in all the memory cells MC.

After that, the voltage of the bit line BL is made to abruptly fall while all the cell transistors CT connected to the word lines WL0 to WL15 are set to the off state. Thus, the PCM material contained in the resistance change memory elements RE provided for the word lines WL0 to WL15 becomes amorphous, and all the resistance change memory elements RE included in the memory string MS become a high resistance state.

In general, the PCM material becomes molten by supplying a predetermined current, in the resistance change memory element using the PCM material for the resistance change layer. Then, the PCM material becomes an amorphous state (high resistance state) by abruptly stopping the supply of the current, and the PCM material becomes a crystalline state (low resistance state) by slowly stopping the supply of the current. In addition, when the PCM material is in a molten state, the resistance is sufficiently lower than that when the PCM material is in the solid state (amorphous state or crystalline state).

As described above, the plurality of cell transistors CT are changed from the on state to the off state in order from one end side toward the other end side of the memory string MS, in the embodiment. That is, the plurality of resistance change memory elements RE are made to function as current paths in order from one end side toward the other end side of the memory string MS. For this reason, the resistance change memory elements RE becomes in a molten state in order from one end side toward the other end side of the memory string MS. At this time, the resistance change layer (PCM material layer) also becomes in a molten state in the area between adjacent resistance change memory elements RE.

As a result, the area of the resistance change layer in a molten state having an extremely low resistance value is gradually extended from one end side to the other end side of the memory string MS. Thus, the resistance change layer becomes a molten state having an extremely low resistance value in all the resistance change memory elements RF and the areas between adjacent resistance change memory elements RE. In such a state, the voltage of the bit line BL is made to abruptly fall. Thus, the resistance change layer becomes an amorphous state (high resistance state) in all the resistance change memory elements RE and the areas between adjacent resistance change memory elements RE.

As described above, the area between the resistance change storage devices RE can be set to an amorphous state (high resistance state) by performing the initialization operation as described above, in the embodiment. For this reason, when writing to the desired resistance change memory element RE (setting the desired resistance state), the electrical insulation between the desired resistance change memory element RE and the resistance change memory element RE adjacent to the desired resistance change memory element RE can be sufficiently secured. As a result, it is possible to prevent an error from being made in writing to the resistance change memory element RE adjacent to the desired resistance change memory element RE, thereby obtaining a highly reliable memory device.

In addition, in the embodiment, the plurality of cell transistors CT are changed from the on state to the off state, in order from one end side toward the other end side of the memory string MS. For this reason, the areas of the resistance change layers in a molten state having an extremely low resistance value are gradually extended in order from one end side toward the other end side of the memory string MS. If all the cell transistors CT are turned off at the same time, a sufficient current cannot be made to flow to the entire resistance change layer since the resistance value of the entire resistance change layer (all the resistance change memory elements RE and the areas between adjacent resistance change memory elements RE) is high. For this reason, the entire resistance change layer cannot be molten, and the entire resistance change layer can hardly be made in an amorphous state (high resistance state). In the embodiment, the entire resistance change layer can easily be made in an amorphous state (high resistance state).

In the embodiment, the structure described in the first embodiment may not necessarily have to be adopted. That is, in the first embodiment, the semiconductor portion 220 included in the pillar structure 200 includes the first portion 221 provided around the resistance change portion 210 and the second portion 222 extending from the first portion 221 but, in the present embodiment, the second portion 222 may not be provided and the first portion 221 alone may be provided. Furthermore, in the present embodiment, a memory string MS extending in a vertical direction as described in the first embodiment does not need to be used, but a memory string MS extending in a horizontal direction may ne used.

In general, in the present embodiment, the memory string MS may include a resistance change portion extending in the first direction, a semiconductor portion including a first portion extending in the first direction and provided along the resistance change portion, and a plurality of conductive layers being apart from each other and arranged in the first direction and arranged along the semiconductor portion.

Third Embodiment

Next, a memory device (nonvolatile memory device) according to the third embodiment will be described. Basic elements are the same as those of the first embodiment, and descriptions of the elements described in the first embodiment will be omitted.

Figure 22:
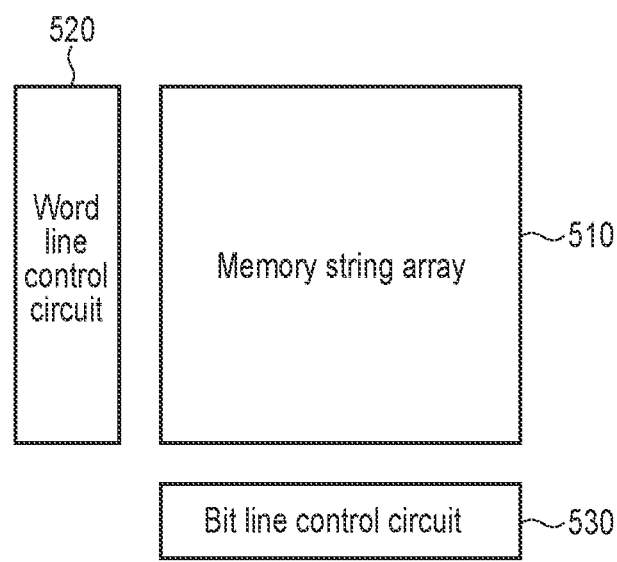
FIG. 22 is a block diagram showing an entire configuration of a memory device according to a third embodiment.

FIG. 22 is a block diagram showing an entire configuration of a memory device according to the present embodiment.

As shown in FIG. 22, the memory device comprises a memory string array 510, a word line control circuit 520, and a b-t line control circuit 530.

The memory string array 51C is formed such that a plurality of memory strings MS described in the first embodiment are arranged in an array.

The word line control circuit 520 controls the plurality of word lines WL described in the first embodiment. That is, cell transistors CT are controlled to be in an on state or an off state by supplying control signals from the word line control circuit 520 to the word lines WL. The word line control circuit 52C also includes a select transistor control circuit which controls the on/off state of the select transistor ST described in the first embodiment.

The bit line control circuit 530 controls a plurality of bit lines BL described in the first embodiment. The bit line control circuit 530 also includes a read circuit which reads a resistance state set (stored) in a resistance change memory element RE.

FIG. 23 is a graph showing resistance change characteristics of the resistance change memory element RE. The horizontal axis indicates a current flowing to the resistance change memory element RE when setting the resistance of the resistance change memory element RE, and the vertical axis indicates a resistance value set in the resistance change memory element RE.

As shown in FIG. 23, the resistance value set in the resistance change memory element RE changes in accordance with the current flowing to the resistance change memory element RE. More specifically, the resistance value set in the resistance change memory element RE increases as the current flowing to the resistance change memory element RE increases. This is considered to ne due to the fact that, in the PCM material, the ratio of the amorphous area increases as the current increases.

As described above, since the resistance value set in the resistance change memory element RE changes by controlling the current flowing to the resistance change memory element RE, multi-valued memory can be performed with the resistance change memory element RE. In the present embodiment, multi-valued memory is performed by a method to be described below.

Figure 24:
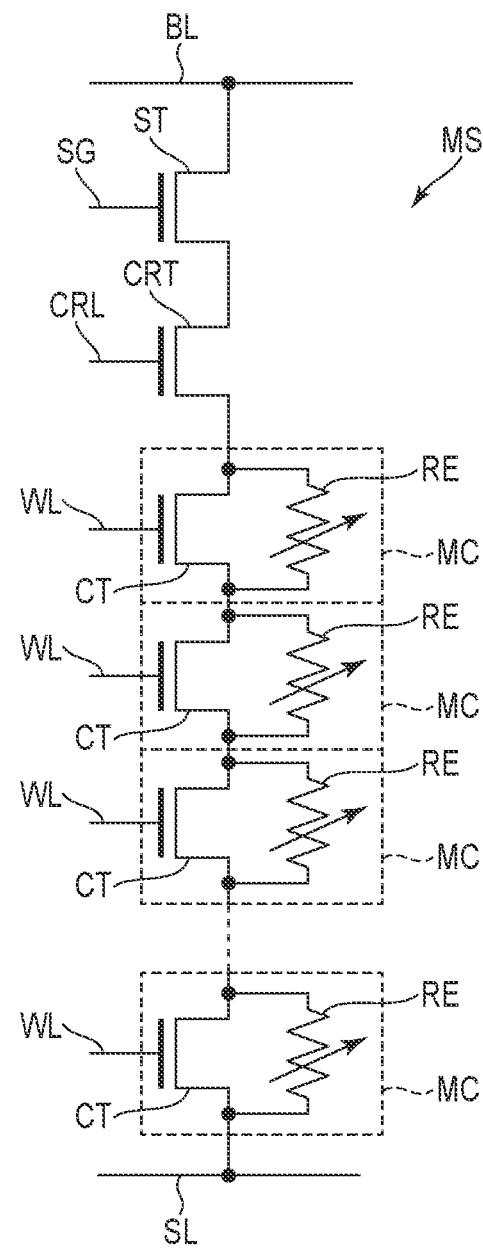
FIG. 24 is a circuit diagram showing a configuration of the memory device according to the third embodiment.

FIG. 24 is a circuit diagram showing a configuration of the memory device according to the present embodiment.

The basic configuration of FIG. 24 is the same as that of the first embodiment shown in FIG. 1. In the present embodiment, however, a control transistor CPT is connected in series to a plurality of memory cells MC and a select transistor ST, and a control gate line CRL is connected to a gate of the control transistor CRT.

The current flowing to the memory string MS is controlled by controlling the control transistor CRT with the control signals from the word line control circuit 520 shown in FIG. 22, such that three or more resistance values can be set to a desired resistance change memory element RE.

Figure 25:
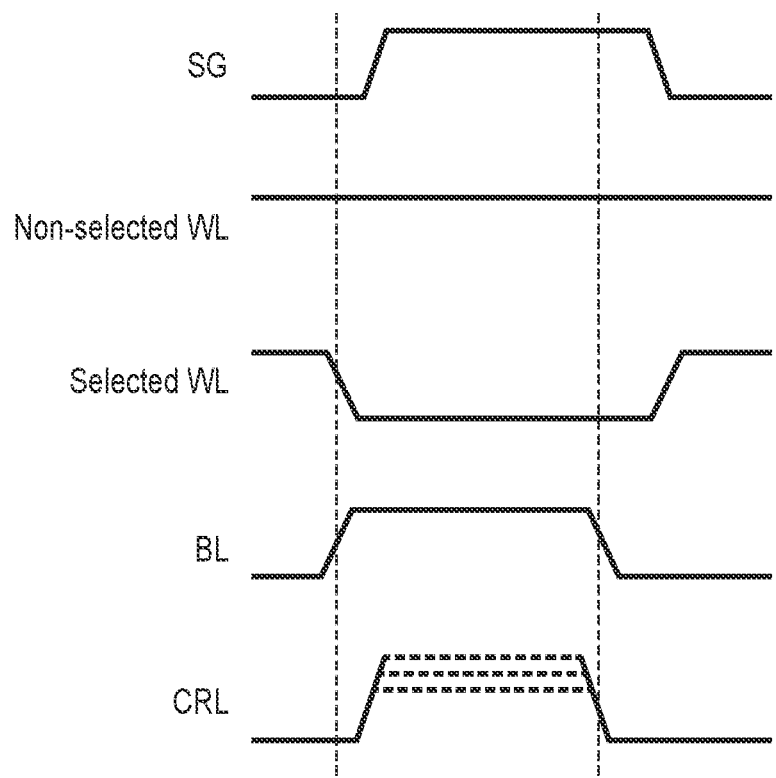
FIG. 25 is a timing chart showing an operation performed when setting a desired resistance state for a desired resistance change memory element, according to the third embodiment.

FIG. 25 is a timing chart showing the operation performed when a desired resistance state is set to a desired resistance change memory element RE. The horizontal axis indicates time and the vertical axis indicates a voltage.

First, the voltage of the word line WL (selected word line) provided for the desired resistance change memory element RE is set to a low level, and the voltages of the word lines WL (non-selected word lines) other than the word line WL provided for the desired resistance change memory element RE are set to a high level. In addition, a predetermined voltage is applied to the bit line BL.

Then, a desired voltage is applied to the control gate line CRL. That is, the voltage corresponding to the resistance state (resistance value) to be set to the desired resistance change memory element RE is applied to the gate of the control transistor CRT. The conductive state of the control transistor CRT is thereby controlled.

Furthermore, the voltage of the select gate line SG is set to a high level and the select transistor ST is set to an on state. A current is thereby supplied from the bit line BL to the memory string MS. At this time, since the conductive state of the control transistor CRT is controlled, the current supplied from the bit line BL to the memory string MS is controlled. That is, the current according to the resistance state (resistance value) to be set to the desired resistance change memory element RE is supplied to the memory string MS.

After that, the voltage of the control gate line CRL is made to fall and the voltage of the bit line is made to further fall. At this time, by causing the voltage of the control gate line CRL to fall abruptly, the current flowing to the desired resistance change memory element RE also falls abruptly. As a result, the desired resistance change memory element RE is set to an amorphous state corresponding to the current value of the current flowing to the desired resistance change memory element RE. That is, the resistance value of the desired resistance change memory element RE is set to a resistance value corresponding to the current value of the current flowing to the desired resistance change memory element RE.

Furthermore, the voltage of the selected gate line SG is changed to a low level, and the voltage of the selected word line WL is changed to a high level.

As described above, in the present embodiment, three or more resistance values can be set for a desired resistance change memory element RE by controlling the current flowing to the memory string MS and making the current flowing to the memory string MS fall abruptly.

Figure 26:
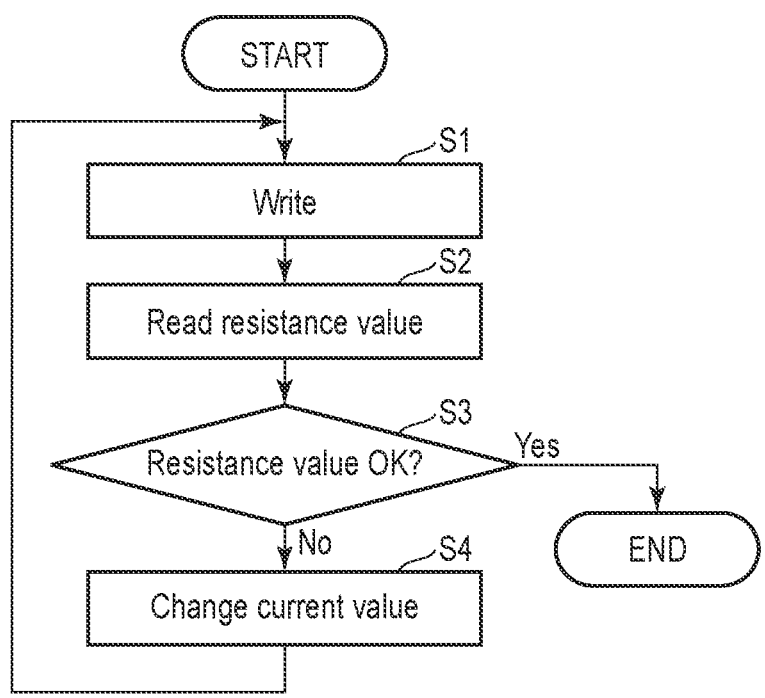
FIG. 26 is a flowchart including a verify operation when setting a desired resistance state for a desired resistance change memory element, according to the third embodiment.

FIG. 26 is a flowchart including a verify operation performed in the case of setting a desired resistance state to a desired resistance change memory element RE.

First, a desired resistance state is set to the desired resistance change memory element RE by the method as described in FIG. 25. That is, writing to the desired resistance change memory element RE is performed (S1).

Then, a verify operation is performed. More specifically, the resistance value set in the desired resistance change memory element RE is read (S2). Furthermore, it is determined whether or not the read resistance value is within a desired resistance value range (S3). When the read resistance value is within the desired resistance value range, the write operation is ended.

When the read resistance value is not within the desired resistance value range, the current value flowing to the memory string MS is changed (S4). That is, the write current flowing to the memory string MS is increased when the read resistance value is smaller than the desired resistance value range, and the write current flowing to the memory string MS is decreased when the read resistance value is larger than the desired resistance value range. Moreover, writing is performed again with the changed current value (S1).

As described above, the above-described operation is repeated until the read resistance value becomes within the desired resistance value range.

Thus, the desired resistance state (desired multi-valued data) can be set reliably to the desired resistance change memory element RE by performing the verify operation.

FIG. 27 is a circuit diagram showing a configuration of a first modified example of the memory device according to the present embodiment.

In the above-described embodiment, the control transistor CRT is provided on the bit line BL side but, in the present modified example, the control transistor CRT is provided on the source line SL side. The basic control method is the same as that in the above-described embodiment, and the same advantages as those of the above-described embodiment can also be obtained in the present modified example.

Next, a second modified example of the memory device according to the present embodiment will be described. A circuit configuration of the memory string MS is the same as the circuit configuration of the above-described embodiment shown in FIG. 24.

Figure 28:
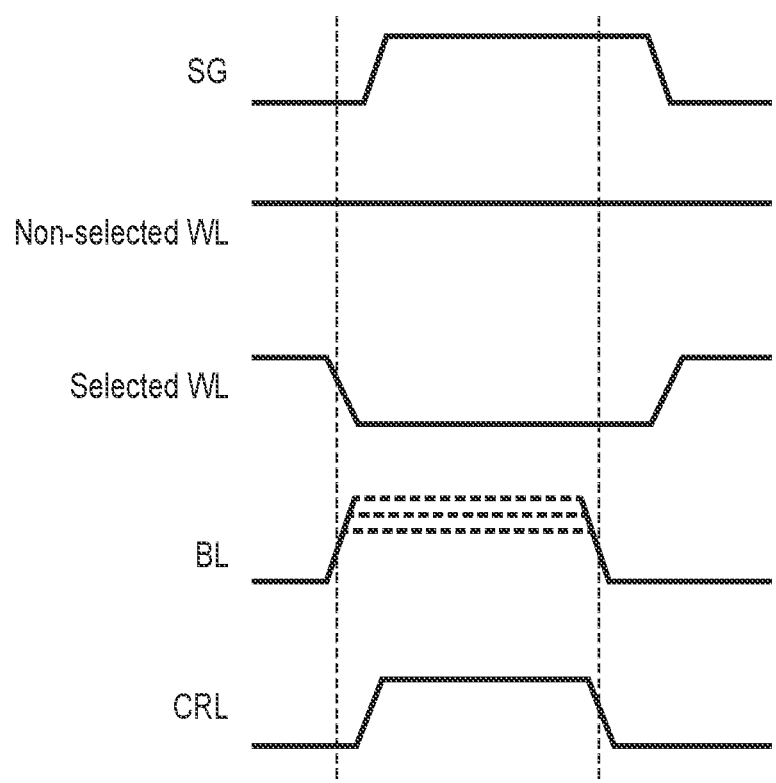
FIG. 28 is a timing chart showing an operation performed when setting a desired resistance state for a desired resistance change memory element, according to a second modified example of the memory device of the third embodiment.

FIG. 28 is a timing chart showing an operation when a desired resistance state is set to a desired resistance change memory element RE. The horizontal axis indicates time and the vertical axis indicates a voltage.

The basic operation timing is the same as the operation timing of the above-described embodiment described with reference to FIG. 25. In the above-described embodiment, however, the write current flowing to the memory string MS is changed by changing the voltage of the control gate line CPL (i.e., the voltage of the control transistor CRT) but, in the present modified example, the on voltage of the control gate line CRL is set to a constant value and the current supplied to the bit line BL is controlled. As a result, the current supplied from the bit line BL to the memory string MS is controlled, and the current flowing to the memory string MS is controlled.

In the present modified example, too, the same advantages as those of the above-described embodiment can be obtained.

In the present embodiment, too, the structure as described in the first embodiment does not need to be adopted, similarly to the second embodiment.

That is, in the first embodiment, the semiconductor portion 220 included in the pillar structure 200 includes the first portion 221 provided around the resistance change portion 210 and the second portion 222 extending from the first portion 221 but, in the present embodiment, the second portion 222 may not be provided and the first portion 221 alone may be provided. Furthermore, in the present embodiment, a memory string MS extending in a vertical direction as described in the first embodiment does not need to be used, but a memory string MS extending in a horizontal direction may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a stacked structure including a plurality of conductive layers stacked to be apart from each other in a first direction; and
   a pillar structure including a resistance change portion extending in the first direction in the stacked structure, and a semiconductor portion which extends in the first direction in the stacked structure and which includes a first portion provided along the resistance change portion and a second portion extending from the first portion in at least one direction intersecting the first direction,
   wherein the stacked structure has a structure in which the plurality of conductive layers and a plurality of insulating layers are stacked alternately in the first direction.

2. The device of claim 1, wherein
   the first portion is in contact with the resistance change portion.

3. The device of claim 1, wherein
the first portion surrounds the resistance change portion.

4. The device of claim 1, wherein
the second portion extends from the first portion in one direction intersecting the first direction.

5. A memory device comprising:
a stacked structure including a plurality of conductive layers stacked to be apart from each other in a first direction; and
a pillar structure including a resistance change portion extending in the first direction in the stacked structure, and a semiconductor portion which extends in the first direction in the stacked structure and which includes a first portion provided along the resistance change portion and a second portion extending from the first portion in at least one direction intersecting the first direction,
wherein the second portion extends from the first portion in a plurality of directions intersecting the first direction.

6. A memory device comprising:
a stacked structure including a plurality of conductive layers stacked to be apart from each other in a first direction; and
a pillar structure including a resistance change portion extending in the first direction in the stacked structure, and a semiconductor portion which extends in the first direction in the stacked structure and which includes a first portion provided along the resistance change portion and a second portion extending from the first portion in at least one direction intersecting the first direction,
wherein the pillar structure further includes a first insulating portion extending in the first direction in the stacked structure and provided between the stacked structure and the semiconductor portion.

7. The device of claim 6, wherein
the pillar structure further includes a second insulating portion extending in the first direction in the stacked structure and surrounded by the semiconductor portion.

8. The device of claim 6, wherein
the stacked structure has a structure in which the plurality of conductive layers and a plurality of insulating layers are stacked alternately in the first direction.

9. The device of claim 1, wherein
a plurality of the pillar structures are arranged parallel to a plane intersecting the first direction.

10. A memory device comprising:
a stacked structure including a plurality of conductive layers stacked to be apart from each other in a first direction;
a pillar structure including a resistance change portion extending in the first direction in the stacked structure, and a semiconductor portion which extends in the first direction in the stacked structure and which includes a first portion provided along the resistance change portion and a second portion extending from the first portion in at least one direction intersecting the first direction; and
a memory string including a plurality of cell transistors each including at least a part of one of the conductive layers and a part of the semiconductor portion, and a plurality of resistance change memory elements provided to correspond to the cell transistors, respectively, and each including a part of the resistance change portion,
wherein
the memory string includes a plurality of memory cells connected in series, each of the memory cells including one of the cell transistors and one of the resistance change memory elements corresponding to the one of the cell transistors, which are connected in parallel.

11. The device of claim 10, wherein
when a desired resistance state is set to one of the resistance change memory elements, one of the cell transistors provided to correspond to the one of the resistance change memory elements is set to an off state and the cell transistors other than the one of the cell transistors are set to an on state.

12. The device of claim 10, wherein
the memory string further includes a select transistor connected in series to the memory cells.

13. A memory device comprising:
a memory string including a resistance change portion extending in a first direction, a semiconductor portion extending in the first direction and including a first portion provided along the resistance change portion, and a plurality of conductive layers arranged to be apart from each other in the first direction and arranged along the semiconductor portion, the memory string including a plurality of cell transistors each including at least a part of one of the conductive layers and a part of the semiconductor portion, and a plurality of resistance change memory elements provided to correspond to the cell transistors, respectively, and each including a part of the resistance change portion; and
a control circuit controlling an operation for the memory string,
wherein
the memory string includes a plurality of memory cells connected in series, each of the memory cells including one of the cell transistors and one of the resistance change memory elements corresponding to the one of the cell transistors, which are connected in parallel,
when setting a desired resistance state to one of the resistance change memory elements, the control circuit sets one of the cell transistors provided to correspond to the one of the resistance change memory elements to an off state and sets the cell transistors other than the one of the cell transistors to an on state, and
when performing initialization for the memory string, the control circuit sets the cell transistors of the memory string to the on state and then causing the cell transistors to change from the on state to the off state in order from one end side toward the other end side of the memory string.

14. The device of claim 13, wherein
each of the resistance change memory elements has a first resistance state and a second resistance state having a higher resistance than the first resistance state, and
the control circuit controls the operation for the memory string such that the resistance change memory elements are set to the second resistance state, in a state in which all the cell transistors are changed to the off state.

15. The device of claim 13, wherein
the resistance change portion extends in the first direction in a stacked structure in which the plurality of conductive layers are stacked to be apart from each other in the first direction, and
the semiconductor portion extends in the first direction in the stacked structure.

16. The device of claim 13, wherein
the semiconductor portion further includes a second portion extending from the first portion in at least one direction intersecting the first direction.

17. The device of claim 13, wherein
the memory string further includes a select transistor connected in series to the memory cells.

18. A memory device comprising:
a memory string including a resistance change portion extending in a first direction, a semiconductor portion extending in the first direction and including a first portion provided along the resistance change portion, and a plurality of conductive layers arranged to be apart from each other in the first direction and arranged along the semiconductor portion, the memory string including a plurality of cell transistors each including at least a part of one of the conductive layers and a part of the semiconductor portion, and a plurality of resistance change memory elements provided to correspond to the cell transistors, respectively, and each including a part of the resistance change portion; and
a control circuit controlling an operation for the memory string,
wherein
the memory string includes a plurality of memory cells connected in series, each of the memory cells including one of the cell transistors and one of the resistance change memory elements corresponding to the one of the cell transistors, which are connected in parallel,
when setting a desired resistance state to one of the resistance change memory elements, the control circuit sets one of the cell transistors provided to correspond to the one of the resistance change memory elements to an off state and sets the cell transistors other than the one of the cell transistors to an on state, and
the control circuit sets three or more resistance values to one of the resistance change memory elements by controlling a current flowing through the memory string.

19. The device of claim 18, wherein
the memory string further includes a control transistor connected in series to the memory cells, and
the control circuit controls the current flowing through the memory string by controlling the control transistor.

20. The device of claim 18, further comprising:
a wire connected to one end of the memory string,
wherein
the control circuit controls the current flowing through the memory string by controlling a current supplied via the wire to the memory string.

21. The device of claim 18, wherein
the resistance change portion extends in the first direction in a stacked structure in which the plurality of conductive layers are stacked to be apart from each other in the first direction, and
the semiconductor portion extends in the first direction in the stacked structure.

22. The device of claim 18, wherein
the semiconductor portion further includes a second portion extending from the first portion in at least one direction intersecting the first direction.

23. The device of claim 18, wherein
the memory string further includes a select transistor connected in series to the memory cells.

* * * * *